United States Patent [19]

Nakajima et al.

[11] Patent Number: 5,763,904
[45] Date of Patent: Jun. 9, 1998

[54] NON-SINGLE CRYSTAL SEMICONDUCTOR APPARATUS THIN FILM TRANSISTOR AND LIQUID CRYSTAL DISPLAY APPARATUS

[75] Inventors: Mitsuo Nakajima, Koshigaya; Yasumasa Gotou, Yokohama; Yoshito Kawakyu, Kawasaki, all of Japan

[73] Assignee: Kabushiki Kaisha Toshiba, Kawasaki, Japan

[21] Appl. No.: 710,110

[22] Filed: Sep. 12, 1996

[30] Foreign Application Priority Data

Sep. 14, 1995 [JP] Japan .................. 7-236392
Sep. 21, 1995 [JP] Japan .................. 7-242249

[51] Int. Cl.$^6$ .................................. H01L 29/76
[52] U.S. Cl. .................. 257/66; 257/72; 257/347; 257/352; 349/43
[58] Field of Search .................. 257/66, 71, 72, 257/347, 352, 353, 354; 349/42, 43

[56] References Cited

U.S. PATENT DOCUMENTS 5,563,427 10/1996 Yudasaka et al. .................. 257/72
5,581,102 12/1996 Kusumoto .................. 257/66
5,583,369 12/1996 Yamazaki et al. .................. 257/66

FOREIGN PATENT DOCUMENTS 64-35960  2/1989  Japan .

*Primary Examiner*—Minh-Loan Tran
*Attorney, Agent, or Firm*—Finnegan, Henderson, Farabow, Garrett & Dunner, L.L.P.

[57] ABSTRACT

A thin film transistor is disclosed, that comprises a first substrate protection film formed on a transparent insulation substrate, a second substrate protection film formed in a predetermined shape on the first substrate protection film, a semiconductor film having a channel region and a contact region formed on the second substrate protection film, the channel region being surrounded by the contact region, a gate insulation film formed above the semiconductor film, the gate insulation film having an opening portion for the contact region of the semiconductor film, a gate electrode formed in a region corresponding to the channel region of the semiconductor film on the gate insulation film, an inter-layer insulation film formed above the gate electrode, the inter-layer insulation film having an opening portion for the contact region of the semiconductor film, and a plurality of electrodes formed on the inter-layer insulation film, the plurality of electrodes being connected to the contact region of the semiconductor film through the opening portion. The edge surfaces of the second substrate protection film may be tapered. A contact state between the gate electrode and the inter-layer insulation film is controlled corresponding to the concentration of hydrogen of the inter-layer insulation film.

19 Claims, 25 Drawing Sheets

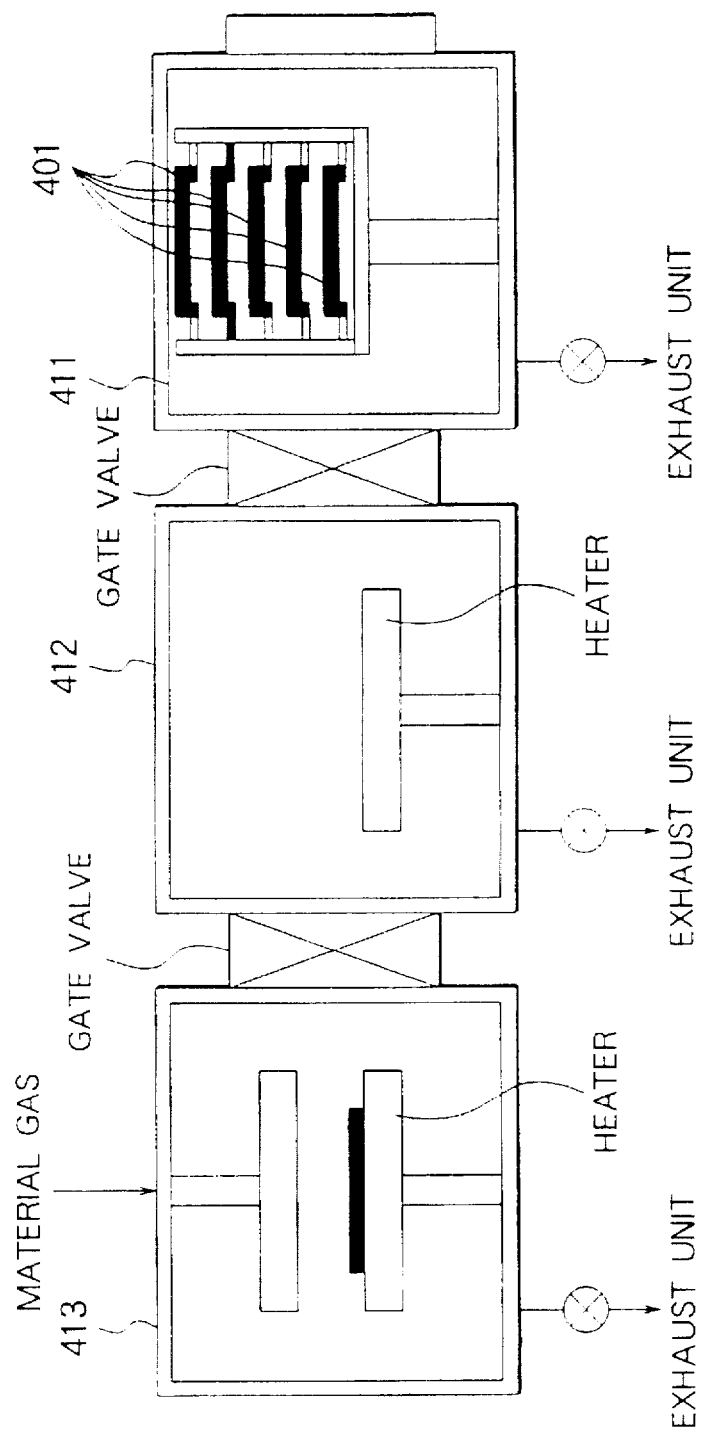

NON-SINGLE CRYSTAL SEMICONDUCTOR APPARATUS THIN FILM TRANSISTOR AND LIQUID CRYSTAL DISPLAY APPARATUS

BACKGROUND OF THE INVENTION

1. Field of the Invention

The present invention relates to a non-single crystal semiconductor apparatus (thin film transistor), a liquid crystal display apparatus therewith, and a fabrication method thereof.

2. Description of the Related Art

A silicon film with a crystal layer (so-called poly-Si film) has been used as a semiconductor film formed on an insulator for an LSI, a liquid crystal display apparatus, and so forth. In particular, since a liquid crystal display apparatus is used for a display portion of a final product, the thickness and size of the final product can be reduced. Thus, needs of the liquid crystal display apparatus are becoming strong for display apparatuses business machines, computers, portable information terminals, and so forth and for special display apparatuses.

Among these display apparatuses, an active matrix type liquid crystal display (AM-LCD) of which thin-film transistors composed of poly-Si are formed as pixel switching devices in a matrix shape has been widely used as a high-image-quality, low-power consumption display.

A poly-Si TFT composed of poly-Si as a channel layer for an AM-LCD TFT has a high carrier mobility. Thus, when the poly-Si TFT is used for a pixel TFT, the switching operation can be precisely performed. The poly-Si TFT can be also used for not only a pixel switching device, but a peripheral drive circuit that controls a pixel TFT.

Consequently, with a drive circuit integrated TFT-LCD of which pixel TFTs and drive circuit TFTs composed of poly-Si are formed on the same substrate, the mounting cost of the drive circuit chip and the frame size thereof can be reduced. Thus, the drive circuit integrated TFT-LCD has been intensively studied and developed.

Among them, a poly-Si film is used for the channel layer of the TFT. Alternatively, a poly-Si into which impurities have been doped is used for an electrode, a source region, and a drain region.

To reduce the cost of the array of a liquid crystal display apparatus, a plurality of small substrates are obtained from a large substrate. After a plurality of arrays are fabricated in a large substrate, they are divided. Thus, a plurality of small array substrates are obtained from the large substrate.

To do that, a TFT forming step using a unit for a large substrate is important. To form a source region and a drain region of a TFT, the ion doping method that allows a large area to be processed and impurities to be doped in a short tact time is becoming attractive. In this method, material hydride as impurities is decomposed by plasma. Without the mass-separation, hydrogen and p type impurities or n type impurities are accelerated and doped into the substrate.

However, when highly concentrated impurities are doped into a poly-Si film by the ion doping method, the surface of the poly-Si film is etched with the hydrogen doped together with the impurities. Thus, the surface morphology deteriorates.

FIG. 1 shows the dependency of concentration of phosphorus (P) as impurities doped in the depth direction of Si with a 100 ppm phosphine/hydrogen ($PH_3/H_2$) gas at doses of $6.8 \times 10^{15}$ and $6.8 \times 10^{16}$ ions/cm$^2$. In addition, FIG. 1 shows the peak positions of P. When the dose is $6.8 \times 10^{16}$ ions/cm$^2$, the peak of P is closer to the surface of Si by around 15 nm than that in the case that the dose is $6.8 \times 10^{15}$ ions/cm$^2$. This is because the surface of Si is etched out by the hydrogen doped together with P. At this point, of course, the surface morphology of Si is bad. After the poly-Si film is doped with highly concentrated impurities by the ion doping method, when the poly-Si film is bonded with a metal such as Al, the contact resistance increases or the Al layer peels off. Thus, an ohmic contact junction cannot be satisfactorily made.

On the other hand, when a large amount of ions are doped into a structure of which a silicon oxide film is coated on poly-Si, similar problem takes place.

FIGS. 2A and 2B show this problem. When a 5% $B_2H_6$ gas diluted with hydrogen is doped into a structure of which a silicon oxide film 2 with a thickness of 100 nm is coated on a poly-Si film 1 with a thickness of 50 nm (see FIG. 2A) at a dose of $3 \times 10^{16}$ ions/cm$^2$, a degraded layer 3 takes place at the interface between the poly-Si film 1 and the silicon oxide film 2 (see FIG. 2B). The contact resistance at the electric connection between the degraded layer 3 and the conductor material is high.

The method of which impurities are mass-separated and then acceleratingly doped into a poly-Si film (in other words, hydrogen are not acceleratingly doped together with impurities), the problem of the degraded layer does not take place. The problem of the degraded layer takes place only when hydrogen and impurities are doped at the same time.

To solve such a problem, conventionally, the doping amount of impurities is limited. Thus, even if the resistance of poly-Si into which the impurities have been doped is relatively high, when poly-Si and a conductor material are electrically connected, a good contact such as an ohmic contact is important.

However, recently, the poly-Si TFT has been used for a drive circuit and so forth. In this case, a high on-current is required. When the doping amount of impurities in the source region and the drain region decreases, the source resistance and the drain resistance are higher than the on-resistance of the TFT. Thus, the on-current cannot be satisfactorily obtained.

To solve this problem, highly concentrated impurities should be doped so as to decrease the source resistance and drain resistance. In addition, a good electric connection should be made between source/drain regions composed of poly-Si and source/drain electrodes composed of a conductor material.

When both highly concentrated hydrogen and impurities are doped in poly-Si or in poly-Si through a thin film composed of for example a silicon oxide film, the morphology on the surface of poly-Si deteriorates or a degraded layer takes place at the interface between the oxide film and poly-Si. Thus, when the conductor material and poly-Si are directly contacted, the contact resistance is high and thereby an ohmic contact hardly takes place. In addition, the adhesion of the conductor material and poly-Si is bad and thereby the conductor film tends to peel off.

FIG. 3A shows the case that the adhesion of the poly-Si 1 and Al 2 is bad (see FIG. 3A). FIG. 3B shows the case that the adhesion of the poly-Si 1 and Al 2 is good. From FIGS. 3A and 3B, it is clear that the morphology of the surface of poly-Si largely affects the peel-off.

On the other hand, currently available drive circuit integrated LCDs are almost medium and small type displays used for projection type displays and view finders. In the fabrication process of a drive circuit integrated LCD, a poly-Si film is formed by the solid phase crystallization method (a process performed at around 600° C.). In addition, since a thermal oxide film (formed at around 900° C. or higher) is used, a high temperature process is used. Thus, an expensive quartz substrate or a high heat resistance substrate should be used. Consequently, the fabrication cost increases.

When a poly-Si film, a gate oxide film, and impurity activation can be formed by a low temperature process at 450° C. or less (at which an inexpensive large glass substrate for an a-Si (amorphous silicon) TFT LCD can be used), many LCD panels can be obtained at a time and thereby the fabrication cost and through-put increase.

As a poly-Si film forming technology and an impurity activating technology in a low temperature process to solve Such a problem, a-Si film crystallizing and impurity activating technology using excimer laser annealing (ELA) method is known. With this technology, since an a-Si film is immediately melted and crystallized, the substrate is less damaged by heat. Thus, an inexpensive glass substrate can be used.

Next, with reference to FIGS. 4A to 4E, a part of the fabrication process of a poly-Si TFT will be described.

An a-Si:H film 12 with a thickness of 50 nm is formed by for example the plasma CVD method on a transparent insulation substrate 11 or a substrate on which an insulation film has been coated. The resultant film is thermally annealed so as to remove hydrogen from the a-Si:H film. Thereafter, a poly-Si is formed by the ELA process (see FIG. 4A).

Next, a poly-Si film 12 as a semiconductor layer of the TFT is patterned. Thereafter, a gate insulation film 13 is formed.

Next, a gate electrode 14 in a predetermined shape is formed on the gate insulation film 13 (see FIG. 4B).

Thereafter, phosphorus (P) is ion-doped into the resultant structure with a mask of the gate electrode (self alignment step) by the ion doping method or the like so as to form a source region 12a and a drain region 12b (see FIG. 4C).

The source region 12a and drain region 12b in the self alignment structure are important to prevent a parasitic capacitor from taking place between the gate electrode and the source/drain regions.

Next, by radiating the excimer laser to the resultant structure, the doped source/drain regions 12a and 12b are activated (see FIG. 4D).

Thereafter, an inter-layer insulation film 15 is formed and then contact holes are patterned. A metal film for a source electrode 17 and a drain electrode 18 is formed and then patterned (see FIG. 4E).

Thus, by the ELA method, a poly-Si film can be formed and impurities can be activated in a low temperature process. However, an under coat layer for preventing Na from diffusing from a glass substrate tends to crack.

On the other hand, when a gate insulation film is formed by the ECR-PECVD method, the film quality is good. However, since the covering characteristic is poor, a step coverage defect of the gate insulation film takes place at an edge portion of the contact region. In addition, the stoichiometry is lost. Thus, a current leakage or/and a dielectric breakdown take place.

Since these problems result in decreases of through-put and yield, they should be solved so as to improve the productivity.

When the ELA method is used, a problem of peel-off of a film arises.

Generally, the sheet resistance of low resistance regions of a semiconductor film as source/drain regions depends on the impurity concentration and the activation thereof. FIG. 5 shows measured results of the relation between the excimer laser radiation energy, doping amount, and sheet resistance for single-layered films. The measured results show that the sheet resistance is reversely proportional to the laser radiation energy and to the doping amount.

Thus, in order to decrease the sheet resistance, it is necessary to increase the laser radiation energy or to increase the doping amount.

However, when the doping amount increases, the doping time increases, thereby lowering the through-put. When the doping amount increases from $5 \times 10^{15}$ atoms/cm$^3$ to $2 \times 10^{16}$ atoms/cm$^3$, the resistance is halved. However, the doping time is quadrupled. Thus, the through-put decreases.

On the other hand, in the case that the resistance of the contact region is decreased through the increase of radiation energy increases, a film peels off in the device fabrication process.

As an example, in the step shown in FIG. 4D, when the radiation energy is increased and the ELA activating process is performed (see FIG. 6A), although the sheet resistance decreases, the gate electrode 14 in the self-alignment structure peels off with more than a particular energy radiation (see FIG. 6B).

To prevent a film from peeling off, after the gate electrode 14 is formed, impurities are doped so as to form source/drain regions 12a and 12b. Before the ELA activating process is performed, an inter-layer insulation film or a protection film 15 is formed (see FIG. 7A).

However, when the ELA activating process is performed in such a manner, although the gate electrode 14 can be prevented from peeling off, due to the film quality of the inter-layer insulation film or protection film 15, as shown in FIG. 7B, the inter-layer insulation film or protection film 15 on the gate electrode peels off.

In addition, a cavity 20 (or a porous portion) is formed at the interface between the gate electrode 14 and the inter-layer insulation film 15 as shown in FIG. 7C. The cavity 20 deteriorates the reliability of the TFT.

Thus, when the ELA process is performed through the inter-layer insulation film or a metal film is disposed as an under layer, since the insulation film peels off, the reliability of the thin film transistor deteriorates and thereby the yield and throughput thereof decrease.

SUMMARY OF THE INVENTION

A first object of the present invention is to provide a semiconductor apparatus that has a good electric connection between a non-single crystal semiconductor doped with highly concentrated hydrogen and impurities and a conductor material and a fabrication method thereof.

A second object of the present invention is to provide a thin film transistor that has a good step coverage of a gate insulation film, excellent characteristics, and high productivity.

A third object of the present invention is to provide a thin film transistor that has a good contact state between a gate electrode and an inter-layer insulation film, a high peel-off resistance of a film, and a high productivity.

A fourth object of the present invention is to provide a liquid crystal display apparatus that has the semiconductor apparatus or thin film transistor according to the above-described first to third objects.

A first non-crystal semiconductor apparatus according to the present invention is a field effect type non-single crystal semiconductor apparatus having a gate electrode formed on an insulation substrate and a source region and a drain region disposed opposite to the gate electrode through the gate insulation film and formed in an impurity doped non-single crystal semiconductor layer doped with hydrogen and n-type impurities or p-type impurities. The apparatus comprises contact holes formed in the source region and the drain region and disposed on the front surfaces of the source region and the drain region, and electrode wires formed in the contact holes and ohmic-contacted in the source region and the drain region.

The first non-single crystal semiconductor apparatus according to the present invention is a non-single crystal semiconductor apparatus, comprising an insulation substrate, a buffer layer formed on the insulation substrate, a non-single crystal semiconductor layer formed on the buffer layer, the non-single crystal semiconductor layer being composed of a channel region, a source region, and a drain region, the channel region being formed between the source region and the drain region, contact holes being formed in the source region and the drain region, the height of the bottom surface of the contact holes being smaller than the height of the surface of the non-single crystal semiconductor layer, a gate electrode formed on the channel region through a gate insulation film, an inter-layer insulation film for coating the non-single crystal semiconductor layer having the gate electrode except for the contact hole portions, and a plurality of electrodes connected to the contact holes and formed on the inter-layer insulation film.

In the non-single crystal semiconductor apparatus, the height of the bottom surface of the contact holes is smaller than the height of the surface of the non-single crystal semiconductor layer by 1 nm to 15 nm.

In the first semiconductor apparatus according to the present invention, after hydrogen and impurities with a high concentration of for example $3 \times 10^{16}$ ions/cm$^2$ are doped into a non-single crystal semiconductor, the surface of the non-single crystal semiconductor is etched out by for example the Chemical Dry Etching (CDE) process. Thereafter, the non-single crystal semiconductor is contacted to a conductor material. According to the present invention, with the etching process, the morphology of the surface of poly-Si is improved. In addition, the adhesion of the non-single crystal semiconductor and the conductor material is easily improved. Moreover, the electric connection between the non-single crystal semiconductor and the conductor material can be easily performed.

A fabrication method of the first non-single crystal semiconductor apparatus according to the present invention comprises the steps of doping impurities including hydrogen and n-type or p-type impurities into a non-single crystal semiconductor thin film on an insulation substrate so as to form an impurity doped non-single crystal semiconductor layer, etching out a degraded layer formed on the surface of the non-single crystal semiconductor thin film, and ohmic-contacting the surface of the resultant non-single crystal semiconductor thin film and a conductor material.

A fabrication method of the first non-single crystal semiconductor apparatus corresponding to the present invention comprises the steps of forming a buffer layer on an insulation substrate, forming a non-crystal semiconductor thin film on the buffer layer, forming a gate insulation film on the non-single crystal semiconductor thin film, forming a gate electrode on the gate insulation film, doping ions into the non-single crystal semiconductor thin film with a mask of the gate electrode so as to form a source region and a drain region, the source region and the drain region including respective contact regions, coating an inter-layer insulation film on the non-single semiconductor thin film having the gate electrode, etching out the inter-layer insulation film on the contact region and a degraded layer on the surface of the contact region so as to form contact holes in the source region and the drain region, and filling the contact holes with a conductor material so as to form a source electrode and drain electrode on the inter-layer insulation film.

A second thin film transistor corresponding to the present invention comprises a substrate protection film formed on a transparent insulation substrate, a semiconductor film having a channel region and a contact region formed on the substrate protection film, the channel region being surrounded by the contact region, a gate insulation film formed above the semiconductor film, the gate insulation film having an opening portion for the contact region of the semiconductor film, a gate electrode formed in a region corresponding to the channel region of the semiconductor film on the gate insulation film, an inter-layer insulation film formed above the gate electrode, the inter-layer insulation film having an opening portion for the contact region of the semiconductor film, the concentration of hydrogen of the inter-layer insulation film being $1 \times 10^{20}$ atoms/cm$^3$ or more, and a plurality of electrodes formed on the inter-layer insulation film and connected to the contact region of the semiconductor film through the opening portion.

In the second thin film transistor according to the present invention, the concentration of hydrogen of the inter-layer insulation film is less than $1 \times 10^{22}$ atoms/cm$^3$.

A third thin film transistor according to the present invention comprises a first substrate protection film formed on a transparent insulation substrate, a second substrate protection film formed in a predetermined shape on the first substrate protection film, a semiconductor film having a channel region and a contact region formed on the second substrate protection film, the channel region being surrounded by the contact region, a gate insulation film formed above the semiconductor film, the gate insulation film having an opening portion for the contact region of the semiconductor film, a gate electrode formed in a region corresponding to the channel region of the semiconductor film on the gate insulation film, an inter-layer insulation film formed above the gate electrode, the inter-layer insulation film having an opening portion for the contact region of the semiconductor film, and a plurality of electrodes formed on the inter-layer insulation film, the plurality of electrodes being connected to the contact region of the semiconductor film through the opening portion.

In the third thin film transistor according to the present invention, the edge surfaces of the second substrate protection film are tapered.

In the third thin film transistor according to the present invention, the edge surfaces of the semiconductor film are tapered.

In the third thin film transistor according to the present invention, the gap between the first substrate protection film and the second substrate protection film is in the range from 1 nm to 100 nm, preferably in the range from 10 nm to 50 nm.

In the third thin film transistor according to the present invention, the concentration of hydrogen of the inter-layer insulation film is $1 \times 10^{20}$ atoms/cm$^3$ or more so as to control a contact state between the gate electrode and the inter-layer insulation film.

A fourth thin film transistor according to the present invention comprises a substrate protection film formed on a transparent insulation substrate, the substrate protection film having a thick region, a semiconductor film having a channel region and a contact region formed on the thick region of the substrate protection film, the channel region being surrounded by the contact region, a gate insulation film formed above the semiconductor film, the gate insulation film having an opening portion for the contact region of the semiconductor film, a gate electrode formed in a region corresponding to the channel region of the semiconductor film on the gate insulation film, an inter-layer insulation film formed above the gate electrode, the inter-layer insulation film having an opening portion for the contact region of the semiconductor film, and a plurality of electrodes formed on the inter-layer insulation film, the plurality of electrodes being connected to the contact region of the semiconductor film through the opening portion.

In the fourth thin film transistor according to the present invention, the edge surfaces of the thick region are tapered.

In the fourth thin film transistor according to the present invention, the height of the thick region of the substrate protection film is in the range from 1 nm to 100 nm, preferably in the range from 10 nm to 50 nm.

In the fourth thin film transistor according to the present invention, the concentration of hydrogen of the inter-layer insulation film is $1\times10^{20}$ atoms/cm$^3$ or more so as to control a contact state between the gate electrode and the inter-layer insulation film.

As described above, in the third and fourth thin film transistors according to the present invention, the thickness of the substrate protection film disposed just below the channel region composed of a high resistance semiconductor film and the drain region and the source region composed of a low resistance semiconductor film is larger than the thickness of the substrate protection film disposed in other regions. The difference between these thicknesses is in the range from 1 nm to 100 nm, preferably, in the range from 10 nm to 50 nm. In these ranges, the edge portions of the semiconductor film can be satisfactorily insulated.

In other words, when the substrate protection film is tapered and then a semiconductor layer is formed thereon, even if a gate insulation film with a bad coating characteristic is formed by for example the ECR-PECVD method, the edge surfaces of the contact region can be properly covered. Thus, since a current leakage and a dielectric breakdown can be reduced, a thin film transistor with excellent characteristics can be obtained.

In the thin film transistor according to the present invention, the channel region that is a high resistance semiconductor layer may have a crystal region.

The semiconductor film may be composed of a poly-Si layer.

The inter-layer insulation film may be formed of for example a silicon oxide film by for example the plasma CVD method.

As described above, according to the third and fourth thin film transistors according to the present invention, since the concentration of hydrogen of the inter-layer Insulation film is $1\times10^{20}$ atoms/cm$^3$ or more, the contact state between the gate electrode and the inter-layer insulation film can be controlled.

Hydrogen of the inter-layer insulation film is mainly present in the form of Si—H$_n$ (where n=1, 2, or 3).

In other words, in the second to fourth semiconductor apparatuses (thin film transistors), experimental results on the problem of peel-off show that when the concentration of hydrogen of the inter-layer insulation film is low, the inter-layer insulation film on the gate electrode is peeled off by the ELA process. Thus, by adjusting the concentration of hydrogen of the film, the contact state between the metal film and insulation film or semiconductor film is improved.

Analysis results by infrared spectrum show the following points.

FIG. 8A shows a typical infrared absorption spectrum of an inter-layer insulation film that is peeled off by the ELA process. FIG. 9A shows a typical infrared absorption spectrum of an inter-layer insulation film that is not peeled off by the ELA process. FIGS. 8B and 9B are enlarged views (at around 2250 cm$^{-1}$) of FIGS. 8A and 9A, respectively. In FIG. 8B, according to the infrared absorption spectrum, the concentration of hydrogen of SiH in the film is $1\times10^{20}$ atoms/cm$^3$. In FIG. 9B, according to the infrared absorption spectrum, the concentration of hydrogen of SiH in the film is $2\times10^{20}$ atoms/cm$^3$.

When the concentration of hydrogen in the inter-layer insulation film is $1\times10^{22}$ atoms/cm$^3$ or more, as shown in FIGS. 10A, 10B, and 10C, the entire film becomes sparse and thereby tatters. Thus, in the next step (the patterning step for contact holes and electrodes), an etching solution soaks into the film, thereby preventing the contact holes and electrodes from being patterned. Even if they are patterned, an electric leakage tends to occur. Thus, since the reliability of the insulation film deteriorates, it is impossible to use it for a device.

When the source region and the drain region are activated by the furnace annealing process rather than the ELA process, the concentration of hydrogen of the inter-layer insulation film may be low. However, in this case, as shown in FIG. 11, the residual stress of the film is large. Thus, the stress affects the source electrode, the drain electrode, and the pixel electrode formed on the inter-layer insulation film. As a result, the electrode material tends to peel off.

Consequently, a line defect and/or a point defect tends to take place in the resultant device (TFT-LCD), thereby deteriorating the image quality.

A fabrication method of the second thin film transistor according to the present invention comprises the steps of forming an amorphous silicon film on a transparent insulation substrate by plasma CVD method, radiating an excimer laser to the amorphous silicon film so as to form a poly-Si film, patterning the poly-Si film so as to form a semiconductor region, forming a gate insulation film on the substrate with the semiconductor region, forming a metal layer on the gate insulation film and patterning the metal layer so as to form a gate electrode, doping impurities from the gate insulation film to the semiconductor region with a mask of the gate electrode so as to form a low resistance source region and a drain region in the semiconductor region, forming an inter-layer insulation film on the gate electrode and the gate insulation film by the plasma CVD method so that the concentration of hydrogen of the inter-layer insulation film is $1\times10^{20}$ atoms/cm$^3$ or more, radiating an excimer laser to the substrate with the inter-layer insulation film so as to activate the source region and the drain region, patterning contact holes on the inter-layer insulation film, etching out the inter-layer insulation film, and forming contact holes in the source region and the drain region, and filling the contact holes with a metal layer so as to form a source electrode and a drain electrode.

A fabrication method of the third thin film transistor according to the present invention comprises the steps of forming a first substrate protection film on a transparent insulation substrate and forming a second substrate protection film at a predetermined position of the first substrate protection film, forming an amorphous silicon film on the second substrate protection film by plasma CVD method and radiating an excimer laser to the amorphous silicon film so as to form a poly-silicon film, patterning the poly-silicon film so as to form a semiconductor region, forming a gate insulation film on the substrate with the semiconductor region, forming a metal layer on the gate insulation film and patterning the metal layer so as to form a gate electrode, doping impurities from the gate insulation film to the semiconductor region with a mask of the gate electrode so as to form a low resistance source region and a drain region in the semiconductor region, forming an inter-layer insulation film on the gate electrode and the gate insulation film by the plasma CVD method, radiating an excimer laser to the substrate with the inter-layer insulation film so as to activate a source region and a drain region, patterning contact holes on the inter-layer insulation film, etching out the inter-layer insulation film, and forming contact holes in the source region and the drain region, and filling the contact holes with a metal layer so as to form a source electrode and a drain electrode.

A first fabrication method of the fourth thin film transistor according to the present invention comprises the steps of forming a substrate protection film having a thick region at a predetermined position on a transparent insulation substrate, forming an amorphous silicon film on the substrate protection film by plasma CVD method and radiating an excimer laser on the amorphous silicon film so as to form a poly-silicon film, patterning the poly-silicon film so as to form a semiconductor region, forming a gate insulation film on the substrate with the semiconductor region, forming a metal layer on the gate insulation film and patterning the metal layer so as to form a gate electrode, doping impurities from the gate insulation film to the channel region with a mask of the gate electrode so as to form a low resistance source region and a drain region in the channel region, forming an inter-layer insulation film on the gate electrode and the gate insulation film by the plasma CVD method, radiating an excimer laser to the substrate with the inter-layer insulation film so as to activate the source region and the drain region, patterning contact holes on the inter-layer insulation film, etching out the inter-layer insulation film, and forming contact holes in the source region and the drain region, and filling the contact holes with a metal layer so as to form a source electrode and a drain electrode.

A second fabrication method of the fourth thin film transistor according to the present invention comprises the steps of forming a substrate protection film on a transparent insulation substrate, forming a poly-silicon film on the substrate protection film, patterning the poly-silicon film, etching out the poly-silicon film, forming a channel region, and etching out the front layer of substrate protection film, forming a gate insulation film on the substrate with the semiconductor region, forming a metal layer on the gate insulation film and patterning the metal layer so as to form a gate electrode, doping impurities from the gate insulation film to the semiconductor region with a mask of the gate electrode and forming a low resistance source region and a drain region in the semiconductor region, forming an inter-layer insulation film on the gate electrode and the gate insulation film by plasma CVD method, radiating an excimer laser to the substrate with the inter-layer insulation film so as to activate the source region and the drain region, patterning contact holes on the inter-layer insulation film, etching out the inter-layer insulation film, and forming contact holes in the source region and the drain region, and filling the contact holes with a metal layer so as to form a source electrode and a drain electrode.

In the second fabrication method of the fourth thin film transistor according to the present invention, the thickness for which the surface layer of the substrate protection film is etched out is in the range from 1 nm to 100 nm, preferably in the range from 10 nm to 50 nm.

In the fabrication method of the third and fourth thin film transistors according to the present invention, the concentration of hydrogen of the inter-layer insulation film is $1 \times 10^{20}$ atoms/cm$^3$ or more.

A liquid crystal display apparatus according to the present invention has thin film transistors as pixel switching devices disposed in a matrix shape, each of the thin film transistors comprising a first substrate protection film formed on a transparent insulation substrate, a second substrate protection film formed in a predetermined shape on the first substrate protection film, a semiconductor film having a channel region and a contact region formed on the second substrate protection film, the channel region being surrounded by the contact region, a gate insulation film formed above the semiconductor film, the gate insulation film having an opening portion for the contact region of the semiconductor film, a gate electrode formed in a region corresponding to the channel region of the semiconductor film on the gate insulation film, an inter-layer insulation film formed above the gate electrode, the inter-layer insulation film having an opening portion for the contact region of the semiconductor film, and a plurality of electrodes formed on the inter-layer insulation film, the plurality of electrodes being connected to the contact region of the semiconductor film through the opening portion.

A liquid crystal display apparatus according to the present invention has thin film transistors as pixel switching devices disposed in a matrix shape, each of the thin film transistors comprising a substrate protection film formed on a transparent insulation substrate, the substrate protection film having a thick region, a semiconductor film having a channel region and a contact region formed on the thick region of the substrate protection film, the channel region being surrounded by the contact region, a gate insulation film formed above the semiconductor film, the gate insulation film having an opening portion for the contact region of the semiconductor film, a gate electrode formed in a region corresponding to the channel region of the semiconductor film on the gate insulation film, an inter-layer insulation film formed above the gate electrode, the inter-layer insulation film having an opening portion for the contact region of the semiconductor film, and a plurality of electrodes formed on the inter-layer insulation film, the plurality of electrodes being connected to the contact region of the semiconductor film through the opening portion.

The liquid crystal display apparatus mentioned above has a storage capacitor adjacent to the thin film transistor formed on the second substrate protection film or thick region of thereof.

In the liquid crystal display apparatus according to the present invention, the concentration of hydrogen of the inter-layer insulation film is $1 \times 10^{20}$ atoms/cm$^3$ or more so as to control a contact state between the gate electrode and the inter-layer insulation film.

As described above, according to the present invention, a thin film transistor having a high reliability and a high productivity and a liquid crystal display apparatus therewith can be provided.

These and other objects, features and advantages of the present invention will become more apparent in light of the following detailed description of best mode embodiments thereof, as illustrated in the accompanying drawings.

BRIEF DESCRIPTION OF THE DRAWINGS

FIG. 20 is a schematic diagram showing an example of a unit for forming an inter-layer insulation film according to the present invention;

DESCRIPTION OF THE PREFERRED EMBODIMENTS

Next, with reference to the accompanying drawings, embodiments of the present invention will be described.

First Embodiment

With reference to FIGS. 12A to 12D, a method for electrically connecting a poly-Si thin film (into which hydrogen and impurities with a high concentration are doped at the same time) according to the present invention and an electric conductive material will be described.

$PH_3$ gas is decomposed into hydrogen and phosphorus by plasma. Hydrogen and phosphorus with a high concentration are acceleratingly doped into a poly-Si 1 at a doping amount of $3 \times 10^{16}$ ions/cm$^2$ (see FIG. 12A).

Figure 12A:
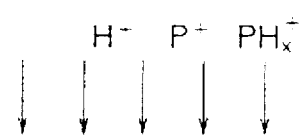
FIGS. 12A, 12B, 12C, and 12D are sectional views for explaining a contact state between a poly-Si thin film and a conductor material according to the present invention.
Figure 12B:
Figure 12C:
Figure 12D:

When hydrogen and phosphorus are doped into the poly-Si 1, since the surface of the poly-Si 1 is etched out with hydrogen and so forth, the morphology of the surface of the poly-Si 2 deteriorates (see FIG. 12B).

When the surface of the poly-Si 2 is etched out, the morphology of the surface of the poly-Si 3 can be improved. At this point, the surface of the poly-Si 2 is etched out by the CDE method at 400 W for 1 minute. It is clear that large particles in the range from 500 nm to 800 nm (in particular, 300 nm to 2 μm) are etched out (see FIG. 12C).

By the etching step, the morphology of the surface of the poly-Si 3 is improved. An electric conductive material for example Al 4 is coated on the poly-Si 3 (see FIG. 12D).

Figure 1:
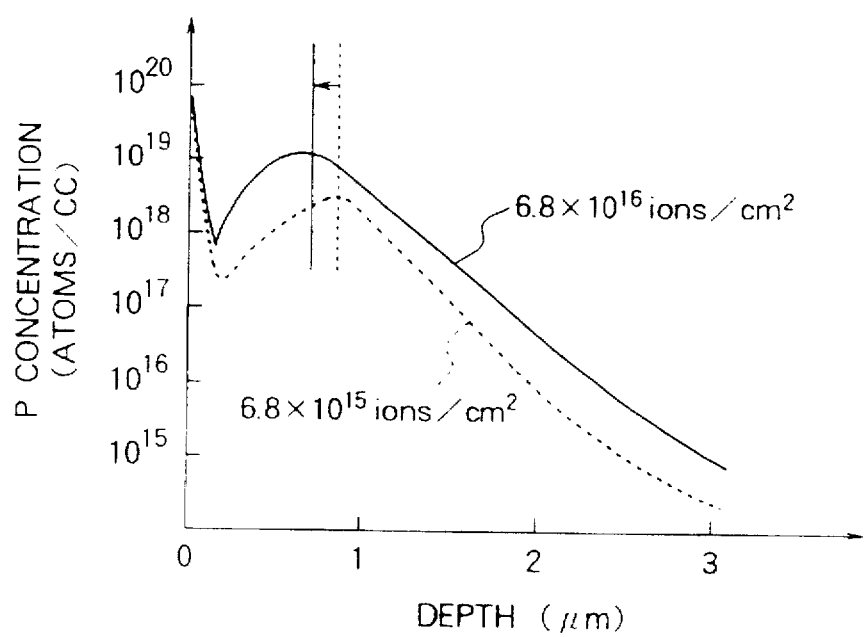
FIG. 1 is a graph showing an impurity profile in an impurity doping method according to the present invention.
Figure 2A:
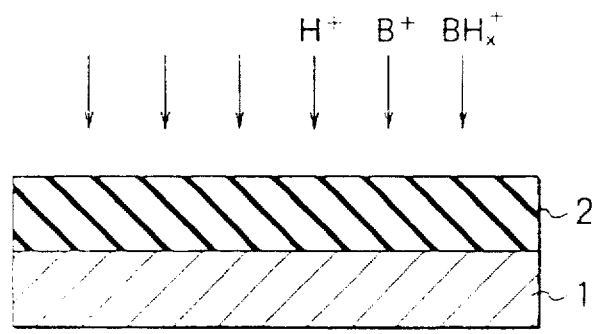
FIGS. 2A and 2B are sectional views showing a portion in which a deformed layer takes place.
Figure 2B:
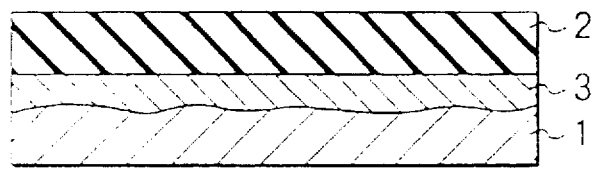
Figures 3A, 3B:
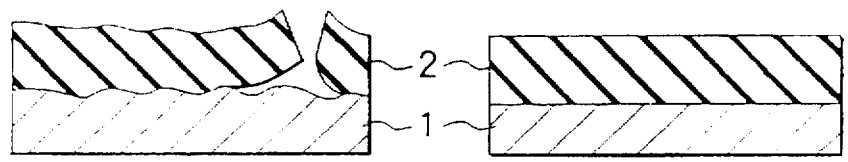
FIGS. 3A and 3B are sectional views for explaining the relation of adhesion of conductor material on the morphology of the surface of poly-Si.
Figure 4A:
FIGS. 4A, 4B, 4C, 4D, and 4E are outlined sectional views showing fabrication steps of a thin film transistor according to a prior art.
Figure 4B:
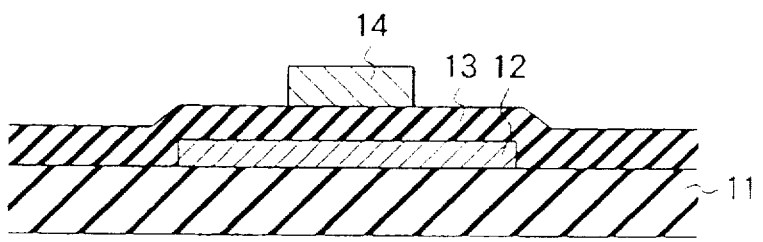
Figure 4C:
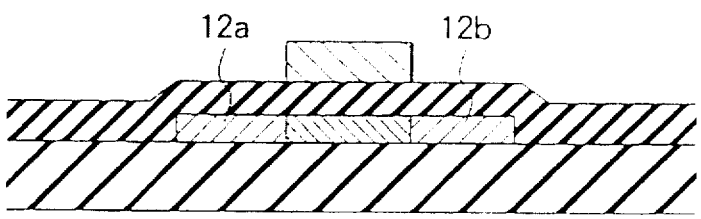
Figure 4D:
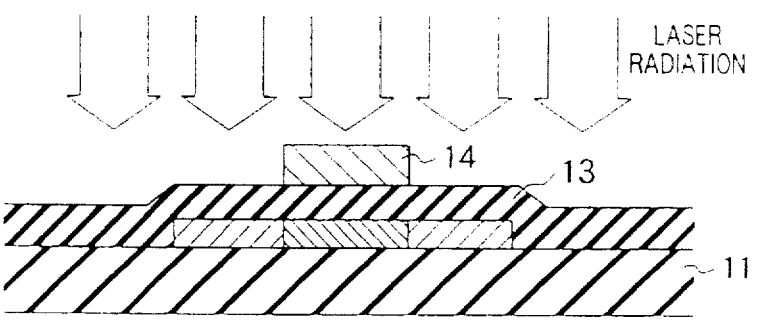
Figure 4E:
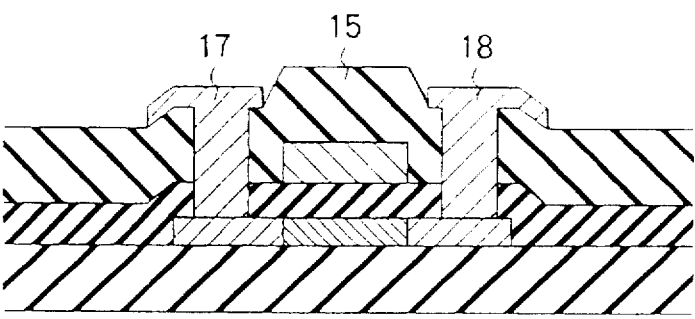
Figure 5:
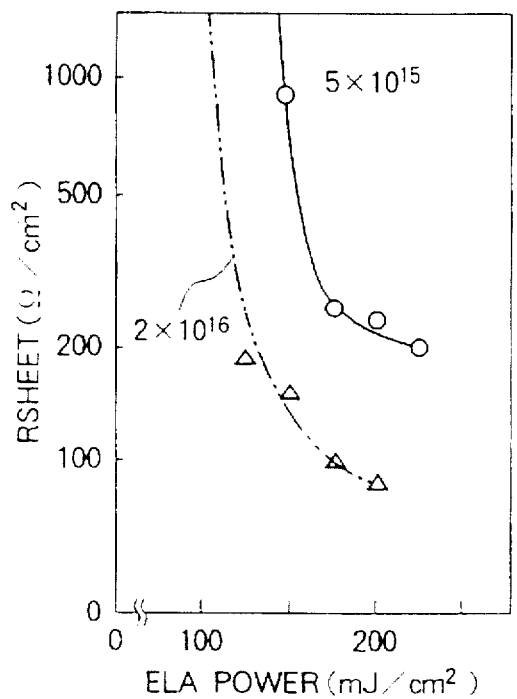
FIG. 5 is a graph showing the relation between radiation energy by the ELA method and sheet resistance in the case that impurities are activated.
Figure 6A:
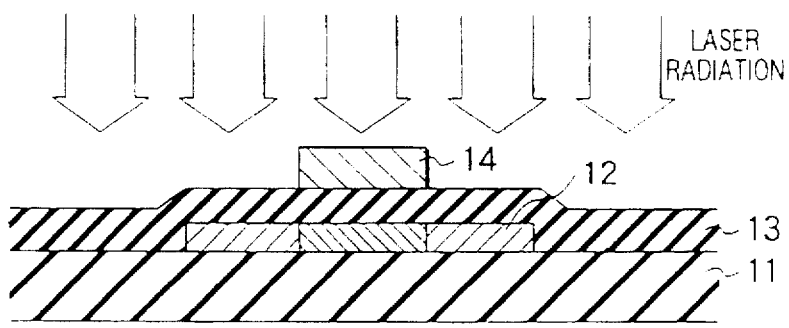
FIGS. 6A and 6B are outlined sectional views showing fabrication steps of a thin film transistor according to a prior art.
Figure 6B:
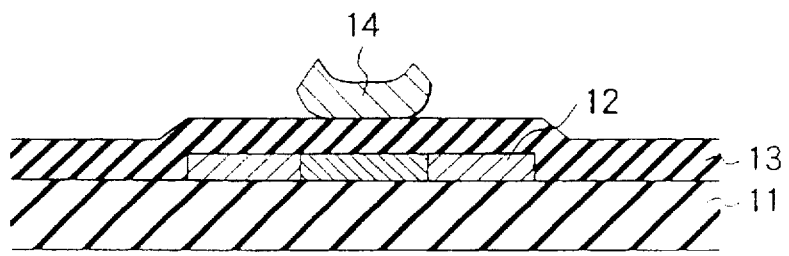
Figure 7A:
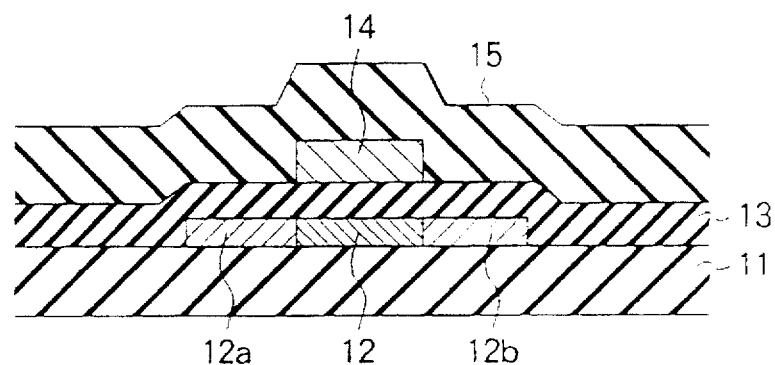
FIGS. 7A, 7B, and 7C are outlined sectional views showing fabrication steps of a thin film transistor according to a prior art.
Figure 7B:
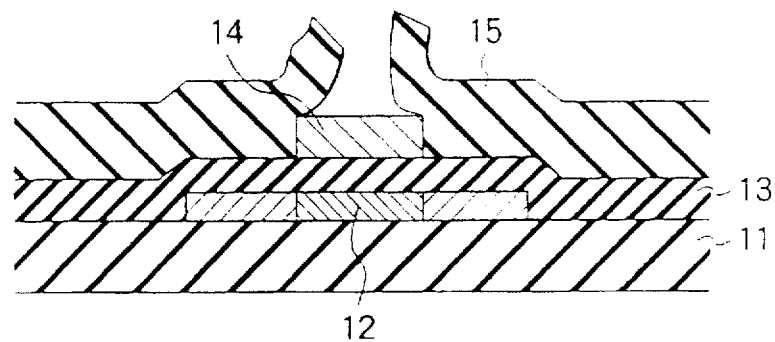
Figure 7C:
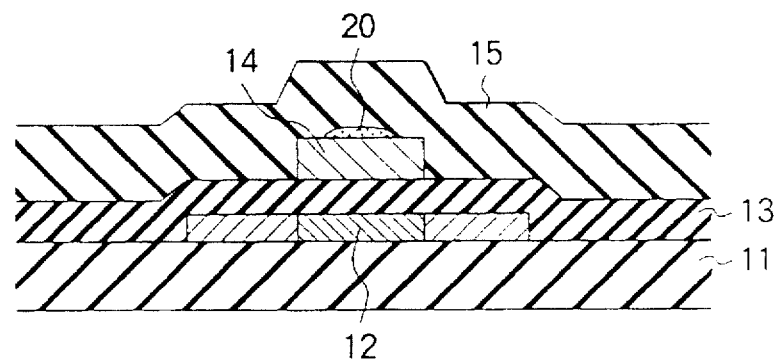
Figure 8A:
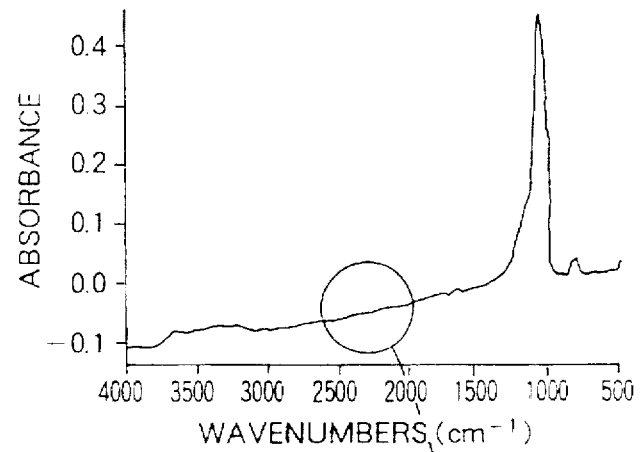
FIG. 8A is a graph showing an infrared absorption spectrum of an inter-layer insulation film of a thin film transistor according to the present invention.
Figure 8B:
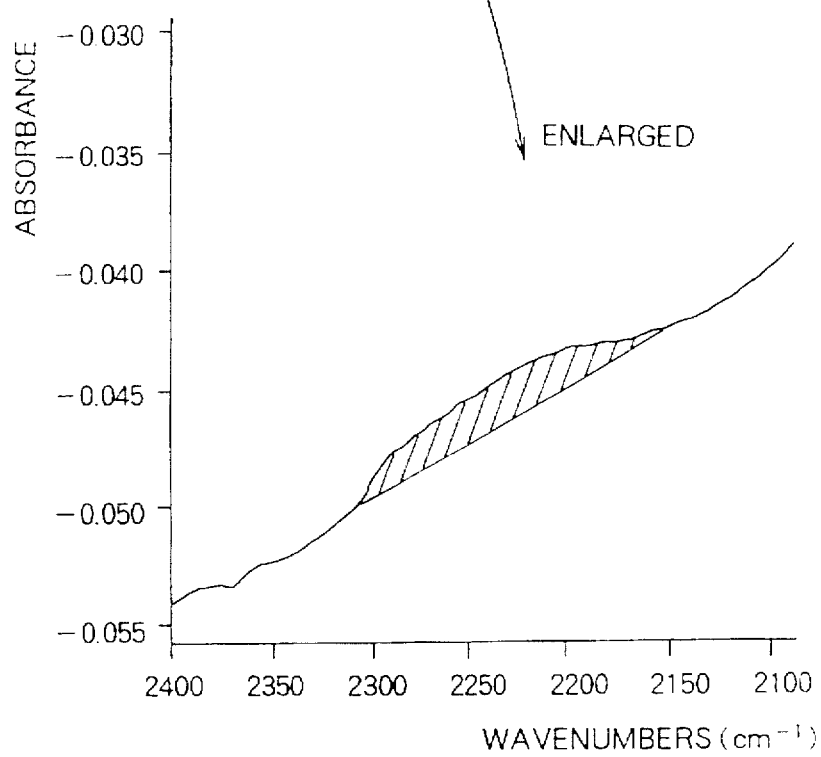
FIG. 8B is a partially enlarged view of FIG. 8A.
Figure 9A:
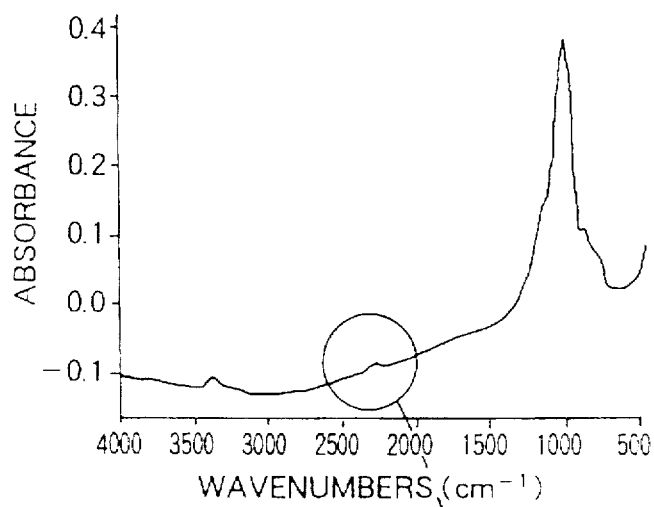
FIG. 9A is a graph showing an infrared absorption spectrum of an inter-layer insulation film of a thin film transistor.
Figure 9B:
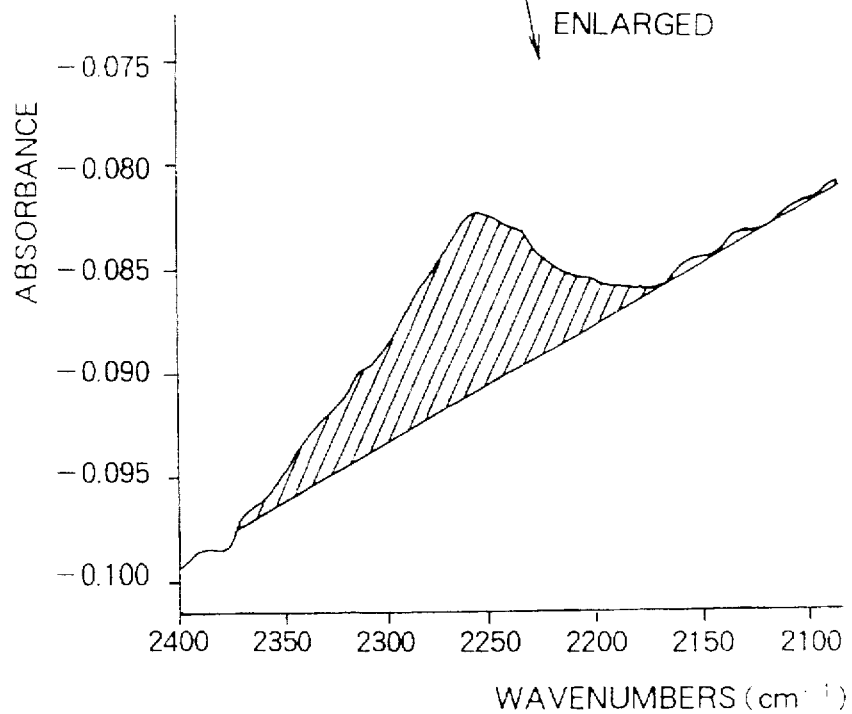
FIG. 9B is a partially enlarged view of FIG. 9A.
Figure 10A:
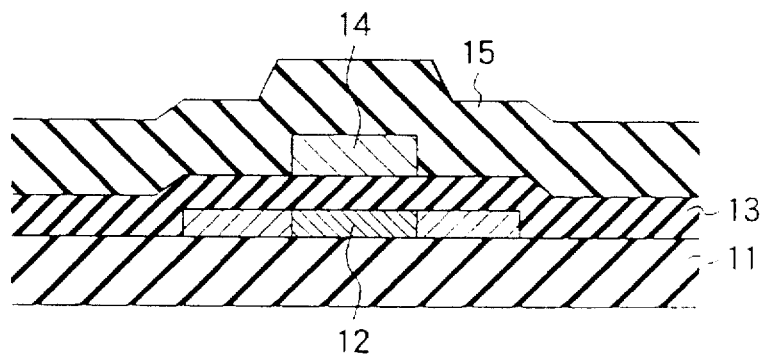
FIGS. 10A, 10B, and 10C are sectional views for explaining an occurrence of an insulation defect in the case that the concentration of hydrogen of an inter-layer insulation film of a thin film transistor is too high.
Figure 10B:
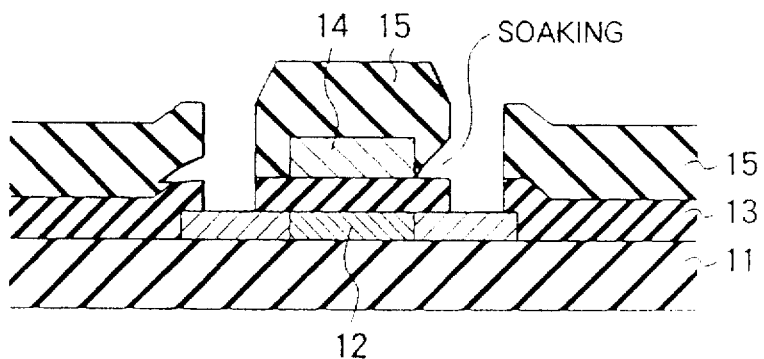
Figure 10C:
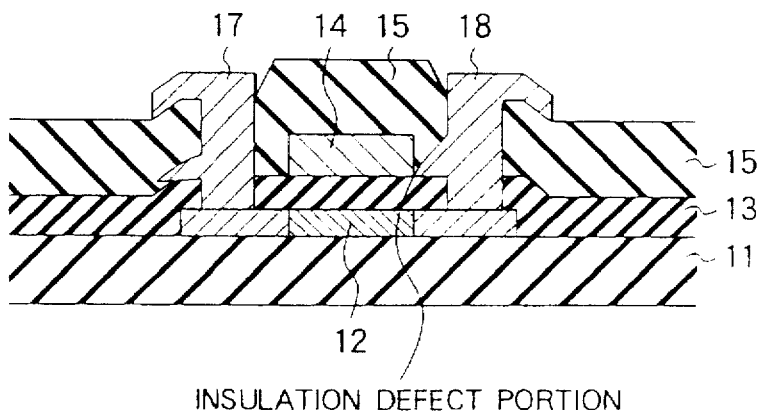
Figure 11:
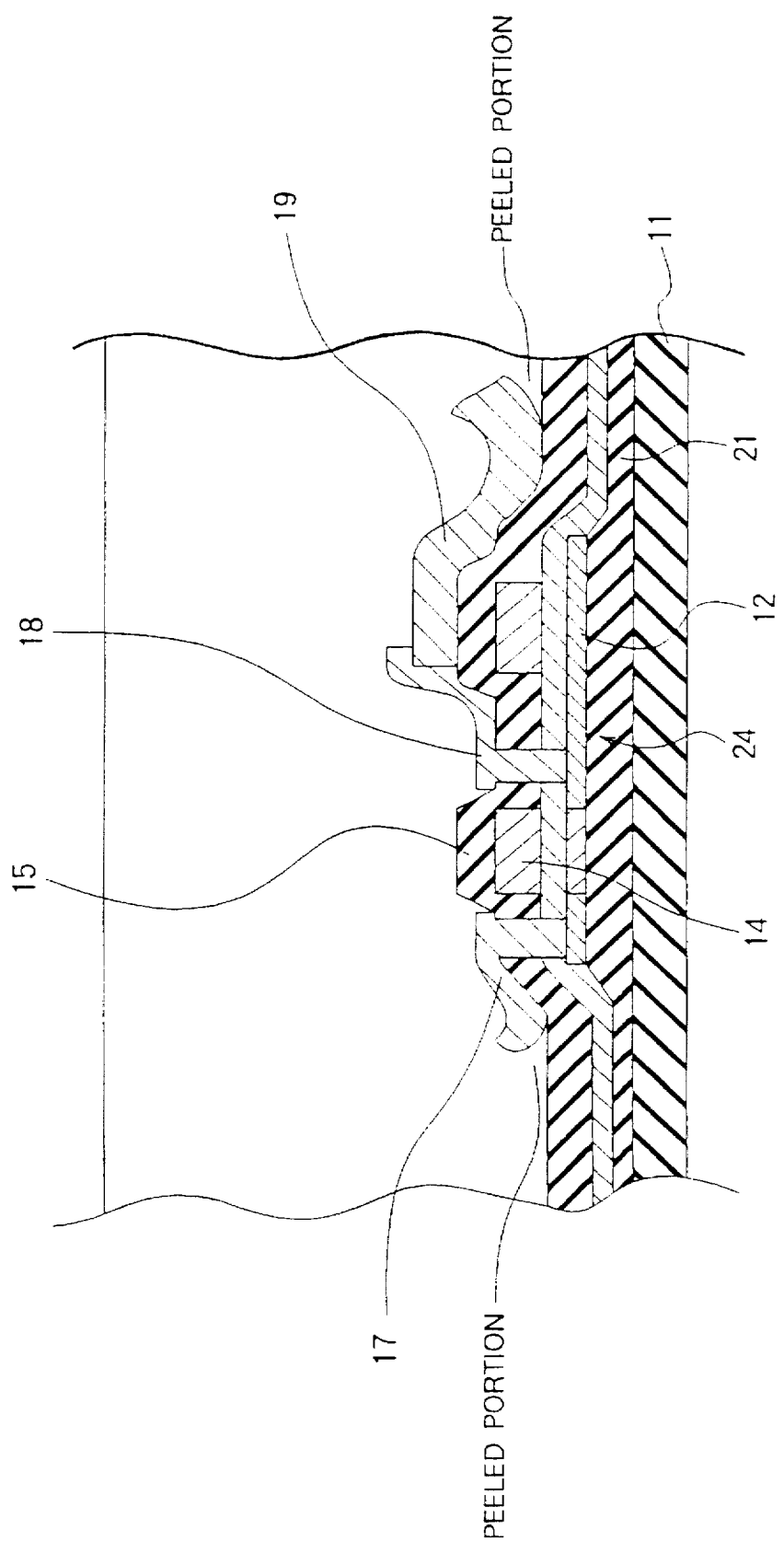
FIG. 11 is a sectional view for explaining an occurrence of an insulation defect in the case that the concentration of hydrogen of an inter-layer insulation film of a thin film transistor is too low.

At this point, the contact state between the poly-Si 3 and the Al 4 accords with the state shown in FIG. 3B. Thus, a good ohmic contact can be accomplished.

In this state, the measured resistance between the poly-Si 3 and the Al 4 is 3 MΩ/cm².

Unless the etching process is not performed, the resistance between the poly-Si and the Al is 300 MΩ/cm².

Test results show that with the etching process the adhesion of the present invention is high and that without the etching process the adhesion of a structure is bad.

This tendency applies to poly-Si into which hydrogen with a concentration in the range from $2 \times 10^{18}$ atoms/cm³ to $8 \times 10^{21}$ atoms/cm³ and conductive impurities with a concentration in the range from $2 \times 10^{19}$ atoms/cm³ to $5 \times 10^{21}$ atoms/cm³ are doped.

Second Embodiment

Next, with reference to FIGS. 13A to 13G, the structure of a first thin film transistor according to the present invention will be described. FIGS. 13A to 13G are sectional views showing fabrication steps of a p-channel type coplanar TFT.

An $SiO_x$ film 21 as a buffer layer with a thickness of around 100 nm is deposited on a transparent insulation substrate 11 composed of a glass substrate, a quartz substrate by the plasma CVD method or the like.

An a-Si:H film with a thickness of around 50 nm is deposited by the CVD method or the like. After the resultant structure is annealed in a furnace at 450° C. for 1 hour. Thereafter, the a-Si:H film is melted and re-crystallized by for example XeCl excimer laser annealing process and thereby a poly-Si film is formed. Next, the poly-Si film 12 is patterned and etched out by the photolithography process (see FIG. 13A).

Figure 13A:
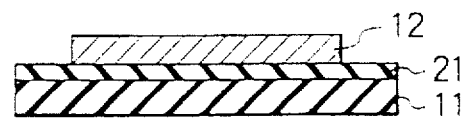
FIGS. 13A, 13B, 13C, 13D, 13E, 13F, and 13G are sectional views showing fabrication steps of a poly-Si thin film transistor according to the present invention.
Figure 13B:
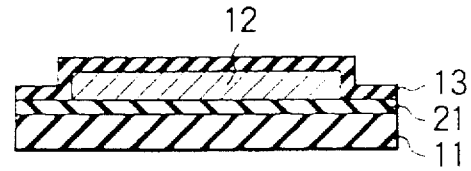
Figure 13C:
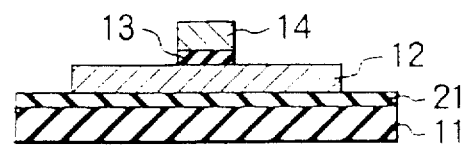
Figure 13D:
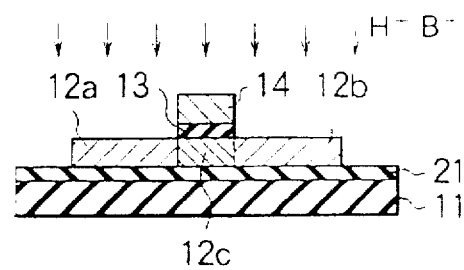
Figure 13E:
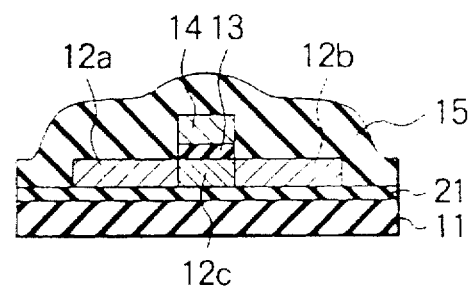
Figure 13F:
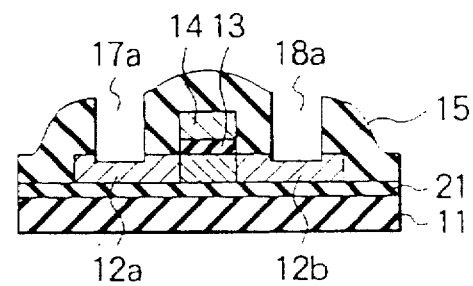
Figure 13G:
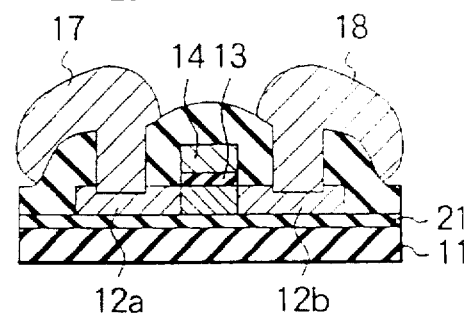

After that, a $SiO_x$ film 13 as a gate insulation film with a thickness of around 100 nm is deposited by the CVD method (see FIG. 13B).

Next, for example a MoTa film with a thickness of 400 nm is deposited. A gate electrode 14 is formed by the photolithography process and the etching process. With a mask of the gate electrode 14, the gate insulation film 13 is etched out (see FIG. 13C).

With the mask of the gate electrode 14, hydrogen and B (boron) are doped into the resultant structure at the same time by the ion doping method. Thus, a source region 12a and a drain region 12b are formed in the self-alignment structure (see FIG. 13D). The ion doping method is performed at an accelerating voltage of around 40 keV and a dose of around $3 \times 10^{16}$ ions/cm². The material gas of the ion doping process is a gas of which $B_2H_6$ is diluted with a rare gas. Examples of the conductive impurities are P and As. In this case, $PH_3$ or $AsH_3$ gas can be used.

Thereafter, a resist and so forth are peeled off. An inter-layer insulation film 15 with a thickness of around 400 nm is deposited by the APCVD method. A source region and a drain region are activated by the furnace annealing process at 600° C. for 3 hours (see FIG. 13E).

Next, the inter-layer insulation film 15 is etched out by the photolithography process and the RIE process. The surface of the source region 12a and the drain region 12b is etched by the CDE process. Thus, contact holes 17a and 18a are formed. The CDE process is performed at 400 W for 1 minute (see FIG. 13F).

Figure 14:
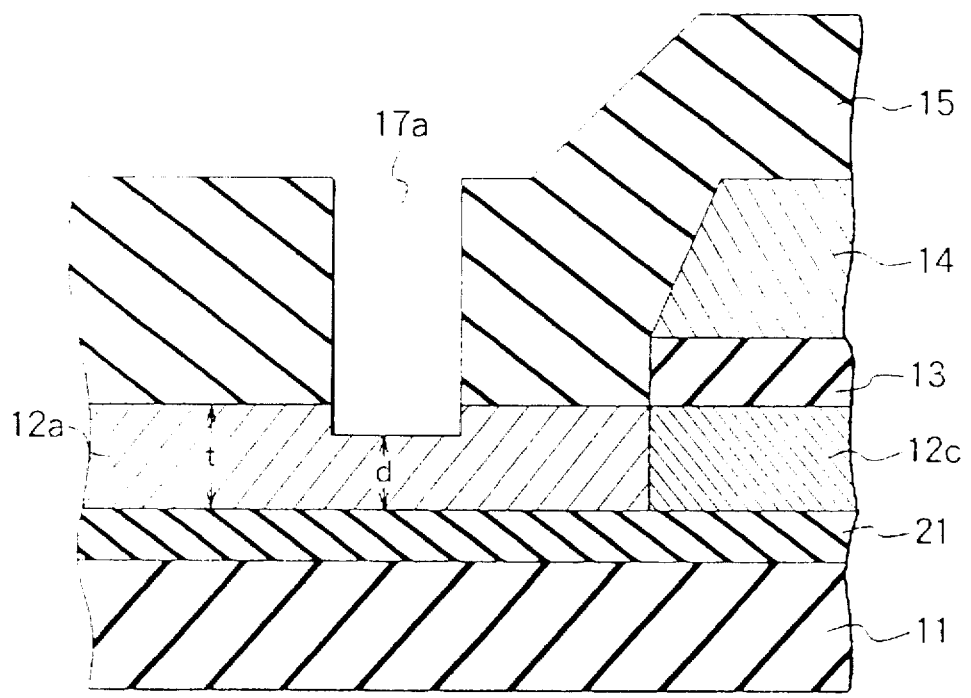
FIG. 14 is an enlarged sectional view showing a contact hole portion of a poly-Si thin film transistor according to the present invention.

FIG. 14 shows an enlarged portion of the hole portion 17a. There is the following relation between the thickness of poly-Si and the thickness of the source film and drain film formed just below the contact holes.

$$0 < d < t \quad (1)$$

where t is the thickness of poly-Si, and d is the thickness of the source film and drain film, formed just below the contact holes.

Thus, (t−d) represents the thickness of the etched poly-Si. (t−d) is preferably in the range from 15 nm to 1 nm, more preferably 5 nm. Depending on the doping condition, as the feature of the poly-Si thin film transistor according to the present invention, the formula (1) is satisfied.

Results of experiments conducted by the inventor show that since the thickness of the deformed layer is in the range from 1 nm to 5 nm, to prevent the deformed layer from adversely affecting the poly-Si TFT, (t−d) should be larger than 5 nm. On the other hand, when (t−d) is too large, since the effective thicknesses of a source region and a drain region decrease, the resistance increases.

Besides $SiO_x$ as the material of the inter-layer insulation film, with a material for example $SiN_x$, BPSG, BSG, or PSG or a laminate containing such a material and another material, the same effect can be accomplished. In other words, the morphology of the surface of poly-Si is improved. Namely, the adhesion between the source/drain regions that do not correspond to the contact holes and the inter-layer insulation film is improved.

Thereafter, for example an Al film as a source electrode and a drain electrode (that are occasionally used as wires) is formed by the sputtering method. The source electrode 17 and the drain electrode 18 are patterned by the photolithography method. Thus, a p-type coplanar TFT is obtained (see FIG. 13G).

In the TFT according to the present invention, highly concentrated hydrogen ($2.5 \times 10^{16}$ ions/cm²) and boron ($1.6 \times 10^{16}$ ions/cm²) are doped into poly-Si. Thus, although the sheet resistance of the source region and drain region is around 400 Ω/cm², the condition that the contact resistance between source/drain regions and source/drain electrodes is lower than the on-resistance of the TFT can be easily accomplished. Thus, a TFT with a high mobility can be provided.

Third Embodiment

In a third embodiment, an example of which the above-mentioned coplanar type TFT is applied for a liquid crystal display will be described.

The coplanar type TFT as a drive circuit is disposed in the periphery of a glass substrate. ITO pixel electrodes are formed in a matrix shape at a center portion of the glass substrate. A drain electrode is connected to each pixel electrode. The above-described TFT is formed as a switching transistor that applies a voltage in the vicinity of the pixel electrode. As a result, an array substrate is obtained. At this point, the drive circuit has gate lines connected to gate electrode of switching transistors and signal lines connected to source electrodes. And gate lines and signal lines are disposed in the matrix shape.

The array substrate is disposed opposite to an opposite substrate having a common electrode formed on the liquid crystal layer side through the liquid crystal layer. As a result, a large liquid crystal display apparatus (for example, a 12-inch OA type large display) is obtained.

Since the large liquid crystal display apparatus has a high drive capacity, a wide gradation can be accomplished. In addition, with a high drive current, the contrast can be improved.

In this embodiment, the coplanar type TFT was described. However, without departing from the spirit and scope of the present invention, various modifications such as an inverted stagger type TFT are available.

Fourth Embodiment

In a fourth embodiment, with reference to FIG. 15A to FIG. 15G, fabrication steps of an n-channel coplanar type thin film transistor will be described.

A $SiO_x$ film 21 as a buffer layer with a thickness of around 100 nm is deposited on a transparent insulation substrate 11 comprised of a glass substrate or a quartz substrate by the plasma CVD method or the like.

An a-Si:H film with a thickness of around 50 nm is deposited by the CVD method or the like. The resultant structure is processed by the furnace annealing process at 450° C. for 1 hour. The a-Si:H film is melted and re-crystallized by for example the XeCl excimer laser annealing method and thereby a poly-Si film 12 is formed. The poly-Si film 12 is patterned by the photolithography method or the like and then etched out (see FIG. 15A).

Figure 15A:
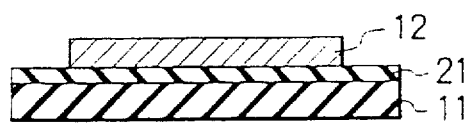
FIGS. 15A, 15B, 15C, 15D, 15E, 15F, and 15G are sectional views showing fabrication steps of another poly-Si thin film transistor according to the present invention.
Figure 15B:
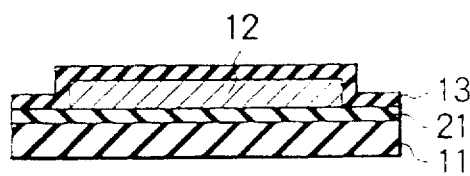
Figure 15C:
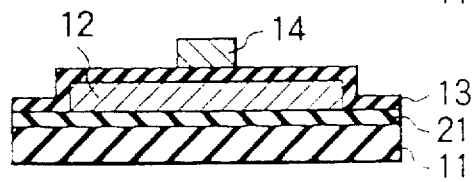
Figure 15D:
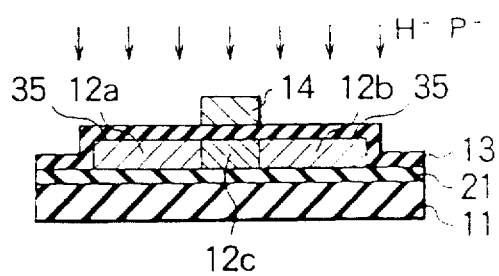
Figure 15E:
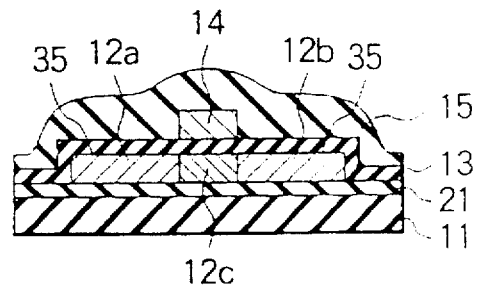
Figure 15F:
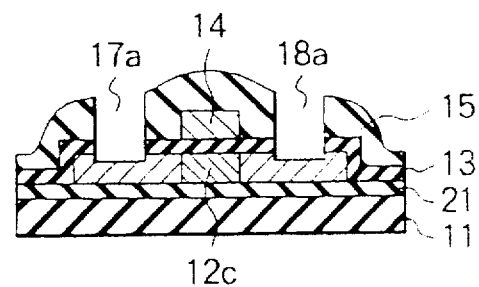
Figure 15G:
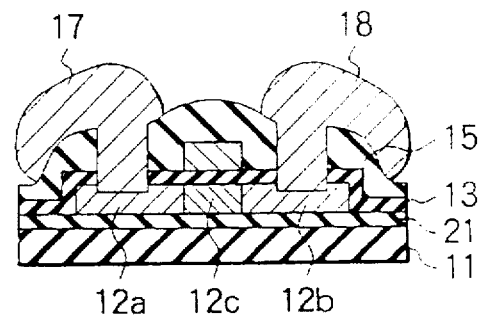

Next, a $SiO_x$ film 13 as a gate insulation film with a thickness of around 100 nm is deposited by the AP (air pressure) CVD method and then annealed at 600° C. for 5 hours (see FIG. 15B).

Thereafter, for example a MoW film with a thickness of 350 nm is deposited. A gate electrode 14 is formed by the photolithography process and the etching process (see FIG. 15C).

With a mask of the gate electrode 14, hydrogen and phosphorus (P) are doped at the same time by the ion doping method. Thus, a source region 12a and a drain region 12b are formed in the self alignment structure. At this point, a deformed layer 35 takes place at the interface of source/drain regions 12a and 12b and a gate oxide film. As described above, the adhesion of the deformed layer 35 and a conductor material is bad and thereby electric connection thereof is bad (see FIG. 15D). The ion doping process is performed at an accelerating voltage of around 80 keV with a dose of around $3 \times 10^{16}$ ions/cm$^2$. The material gas of the ion doping process is a gas of which $PH_3$ is diluted with a rare gas.

Thereafter, the resist and so forth are peeled off. An inter-layer insulation film 15 with a thickness of around 400 nm is deposited by the APCVD method. The source region and drain region are activated by the XeCl excimer laser annealing process (see FIG. 15E).

The inter-layer insulation film 15 and the gate insulation film 13 are etched out by the photolithography process and the RIE process. The surface of the deformed layer 35, the source region 12a, and the drain region 12b are etched out by the CDE process. Thus, contact holes 17a and 18a are formed (see FIG. 15F).

Figure 16:
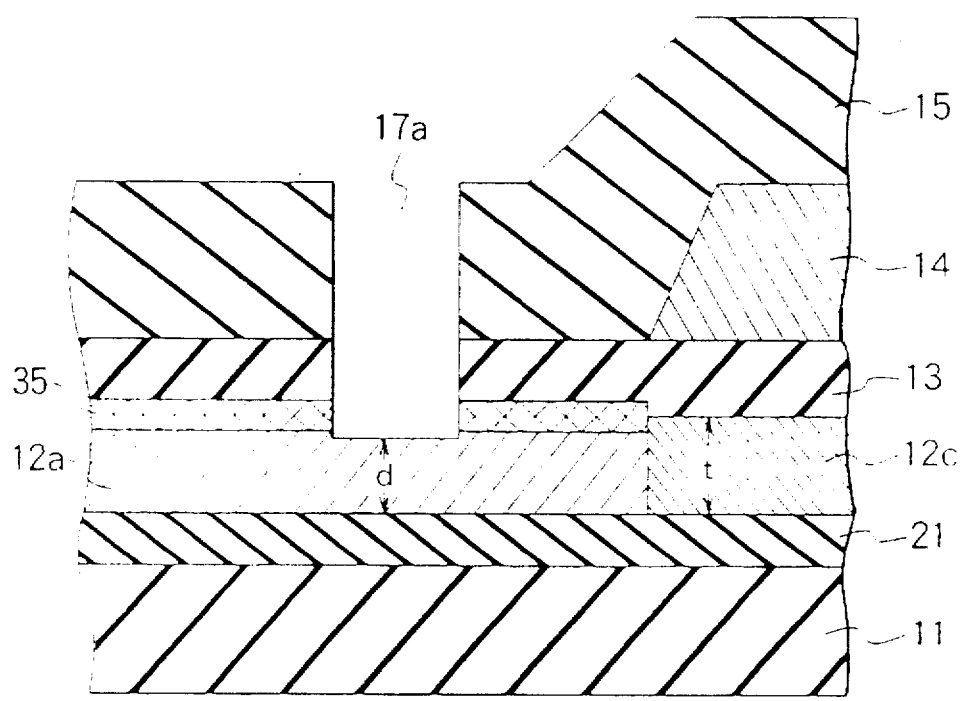
FIG. 16 is an enlarged sectional view showing a contact hole portion of the other poly-Si thin film transistor according to the present invention.

At this point, it is clear that the relation 0<d<t is satisfied (where t is the thickness of poly-Si film, and d is the thickness of source and drain films just below the contact holes). In addition, the deformed layer 35 is completely removed. In FIG. 16, the deformed layer, the source region 12a, and the drain region 12b are etched out. However, it is not always necessary to etch out the source region 12a and the drain region 12b, but only the deformed layer 35. The deformed layer is composed of for example $Si_xO_yP_z$ or $Si_xO_yB_z$.

Thereafter, for example an Al film as the source electrode and the drain electrode are formed by the sputtering method. The source electrode 17 and the drain electrode 18 are patterned by the photolithography process or the like. As a result, an n-channel coplanar type TFT is obtained (see FIG. 15G).

The TFT according to the fourth embodiment has the same effect as the TFT according to the second embodiment.

In the TFT according to the present invention, since highly concentrated hydrogen and phosphorus are doped into poly-Si, although the sheet resistance of the source region and the drain region is around 350 Ω/cm$^2$, the structure of which the contact resistance between the source/drain regions and the source/drain electrodes is lower than the on-resistance of the TFT can be easily accomplished. Thus, a TFT with a high mobility can be provided.

In the fourth embodiment, the metal contacted to the poly-Si film may be MoTa, MoN, MoW, Cr, Mo, Cu, or the like besides Al. Even if such metal materials are used, the same results as the fourth embodiment can be obtained. However, when MoTa is used, the temperature at which the later processes can be performed is 600° C. in contrast with 400° C. of Al. When MoN is used, the temperature at which the later processes can be performed becomes 500° C.

In the fourth embodiment, poly-Si as a non-single crystal semiconductor was described. However, with microcrystal silicon of which particles of poly-Si are mixed in a non-single crystal silicon other than poly-Si (for example, amorphous-Si), the same effects can be accomplished. The semiconductor according to the fourth embodiment is not limited to silicon. With Ge, C, SiGe, SiC, or the like, the same effects as the fourth embodiment can be accomplished.

In the fourth embodiment, the coplanar type TFT was described. However, without departing from the spirit and scope of the present invention, the fourth embodiment can be applied for various TFTs. The electric connecting method for the poly-Si film according to the present invention can be applied for both a pair of hydrogen and n-type impurities and another pair of hydrogen and p-type impurities as doped impurities.

Fifth Embodiment

Figure 17:
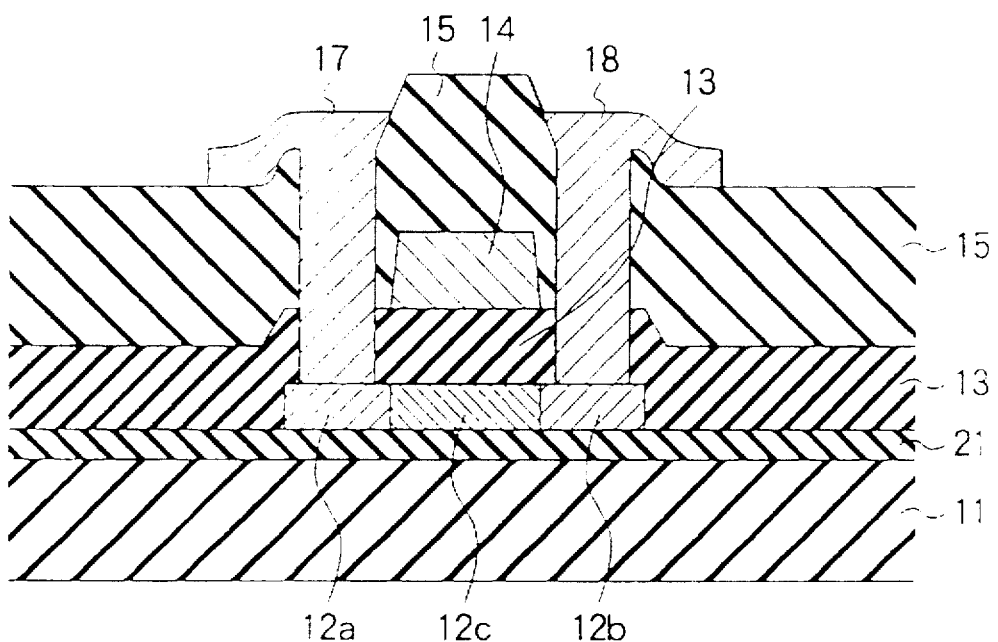
FIG. 17 is an outlined sectional view showing an example of a second thin film transistor according to the present invention.

Next, with reference to FIG. 17, a second thin film transistor according to the present invention will be described.

First, the structure of the second thin film transistor according to the present invention will be described. A substrate protection film 21 is formed on a transparent insulation substrate 11. A thin film transistor with a channel region composed of a poly-crystal high resistance semiconductor film is formed on the substrate protection film. The substrate protection film may have a thick region in a predetermined shape.

In the thin film transistor, a channel region 12c composed of a high resistance semiconductor film is electrically contacted to a source region 12a and a drain region 12b that are contact regions composed of low resistance semiconductor films. A gate electrode 14 is disposed through the channel region 12c and the gate insulation film 13. The source region 12a and the drain region 12b are connected to a source electrode 17 and a drain electrode 18, respectively. An inter-layer insulation film 15 is disposed between the gate electrode 14 and the source electrode 17 and between the gate electrode 14 and the drain electrode 18 so as to insulate them. The inter-layer insulation film 15 contains hydrogen. The concentration of hydrogen of the film 15 is $1 \times 10^{20}$ atoms/cm$^3$ or more. In this structure, when a high energy beam is radiated by for example excimer laser in the activating process for the source region and the drain region, after the inter-layer insulation film is formed, even if the ELA process is performed, the inter-layer insulation film can be prevented from peeling off from the gate electrode. Thus, the thin film transistor can be effectively fabricated.

Sixth Embodiment

With reference to FIGS. 18A to 18E, a fabrication method of the thin film transistor according to the fifth embodiment will be described. Amorphous silicon with a thickness of around 50 nm is formed on a transparent insulation substrate 11 or a transparent substrate 11 on which an insulation film 12 has been coated by the plasma CVD method. Thereafter, the resultant structure is annealed in a nitrogen atmosphere at around 450° C. for around 1 hour so as to decrease hydrogen in the amorphous silicon. Thereafter, a high energy of such as an excimer laser (XeCl or XeF) (with radiation energy of 300 to 350 mJ/cm$^2$) is radiated to the resultant structure. Thus, a poly-Si 12 is obtained (see FIG. 18A).

The poly-Si film 12 may be formed by the LPCVD method or the plasma CVD method using a mixed gas of $SiH_4$, $SiF_4$, and $H_2$.

Figure 18A:
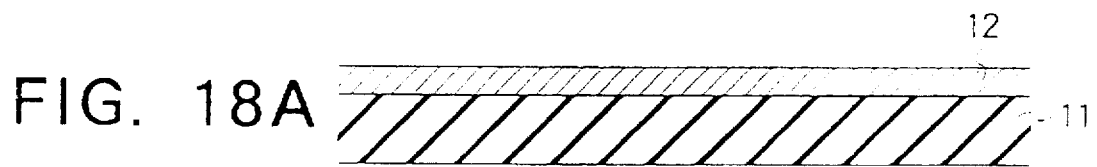
FIGS. 18A, 18B, 18C, 18D, and 18E are outlined sectional views showing fabrication steps of the second thin film transistor according to the present invention.
Figure 18B:
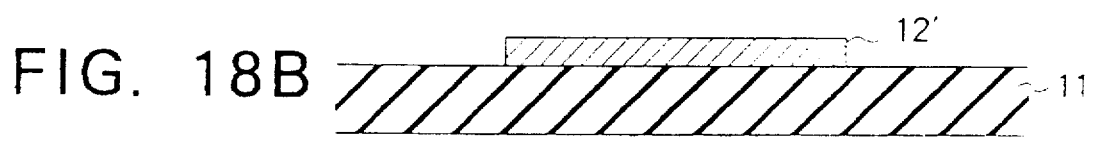

Thereafter, the poly-Si film 12 is patterned by the photo-lithography process and thereby a semiconductor region 12' is formed (see FIG. 18B).

Next, a gate insulation film 13 with a thickness of around 70 to 100 nm is formed by the plasma CVD method, the AP CVD method, or the like.

A metal as a gate electrode is formed by the sputter method or the like and then patterned. As a result, a gate electrode 14 is formed. Thereafter, with a mask of the gate electrode, phosphorus with a concentration of $5 \times 10^{15}$ atoms/cm$^3$ as impurities is doped by the self-alignment process for example the ion doping process. Thus, a source region 12a and a drain region 12b as low resistance contact regions are formed (see FIG. 18C). Examples of the metal material for the gate electrode are aluminum, tangusten, molybdenum, tantalum, copper, titanium, alloys thereof, and laminates thereof.

Figure 18C:
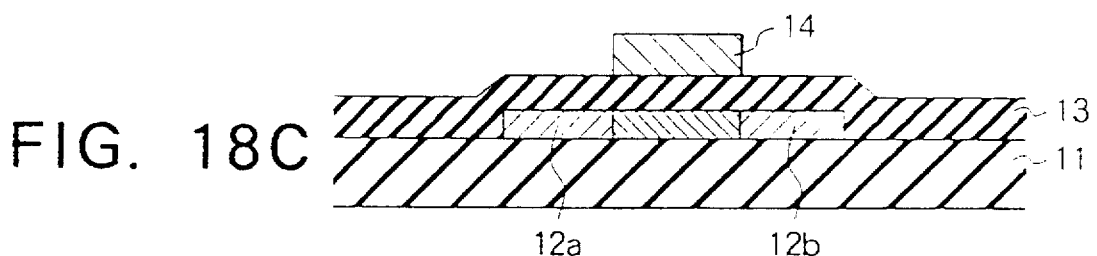
Figure 18D:
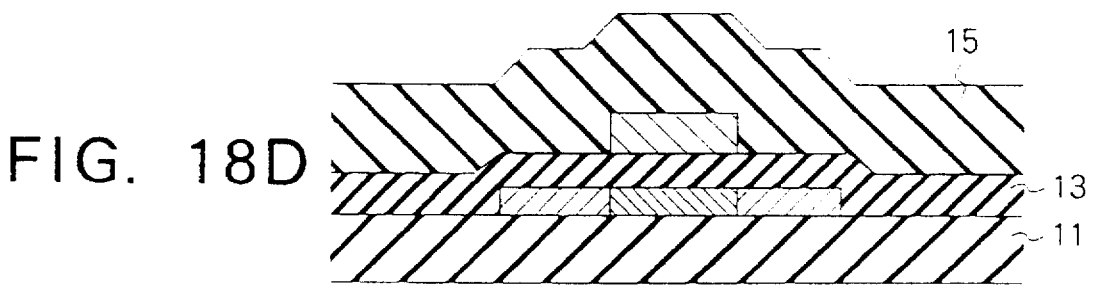

Thereafter, an inter-layer insulation film 15 is formed. Next, the method for forming the inter-layer insulation film 15 will be described. The resultant structure shown in FIG. 18C is properly rinsed. The inter-layer insulation film 15 is formed by an insulation film forming unit (see FIG. 18D). The insulation film forming unit is for example a plasma CVD unit as shown in FIG. 20.

Next, an example of the film forming method using such a unit will be described. A substrate on which an insulation film is formed is placed in a loading/unloading chamber 411. The loading/unloading chamber 411 is deaerated by an exhaust unit. After a predetermined vacuum is obtained, the substrate is transferred to a pre-heating/cooling chamber 412. To reduce the process time, the substrate is heated to a predetermined temperature (for example, 330° C.) in the preheating/cooling chamber 412. Thereafter, the substrate is transferred to a film forming chamber 413. After the substrate is transferred to the film forming chamber 413, a gate valve is closed. Thereafter, the film forming chamber 413 is deaerated by an exhaust unit such as a turbo molecular pump and/or a rotary pump. Next, a material gas ($SiH_4$, $N_2O$) of the insulation film (if necessary, a mixed gas of the material gas and a rare gas ($N_2$, $H_2$, He)) is supplied to the film forming chamber. The substrate is heated to a predetermined temperature by a heater. The heated temperature is preferably in the range from 300° to 400° C. The exhaust unit and the gas supply amount are adjusted to a pressure necessary and suitable for forming the insulation film (for example, 0.5 Torr). After the pressure and flow of the gas and the temperature of the substrate become stable, a radio frequency of for example 13.56 MHz is applied so as to generate plasma. Thus, the material gas is decomposed and the insulation film is formed on the substrate. The ratio of flow rates of $SiH_4$ and $N_2O$ is preferably 1 to 50. For example, $N_2O$ of 200 sccm may be supplied against $SiH_4$ of 5 sccm.

After the desired film is formed, the generation of the radio frequency is stopped. The film forming chamber is deaerated to a predetermined vacuum by the exhaust unit. Next, the gate value is opened. If necessary, the substrate is transferred to the pre-heating/cooling chamber and cooled to a predetermined temperature. Next, the substrate is transferred to the loading/unloading chamber and unloaded from the chamber.

Thereafter, the substrate is annealed by the excimer laser so as to active the source region and the drain region. Experimental results show that the insulation film formed by the annealing process using the excimer laser neither peels off from a metal film nor becomes sparse. This is because the concentration of hydrogen of the inter-layer insulation film of the TFT is $1 \times 10^{20}$ atoms/cm$^3$ or more.

Figure 18E:
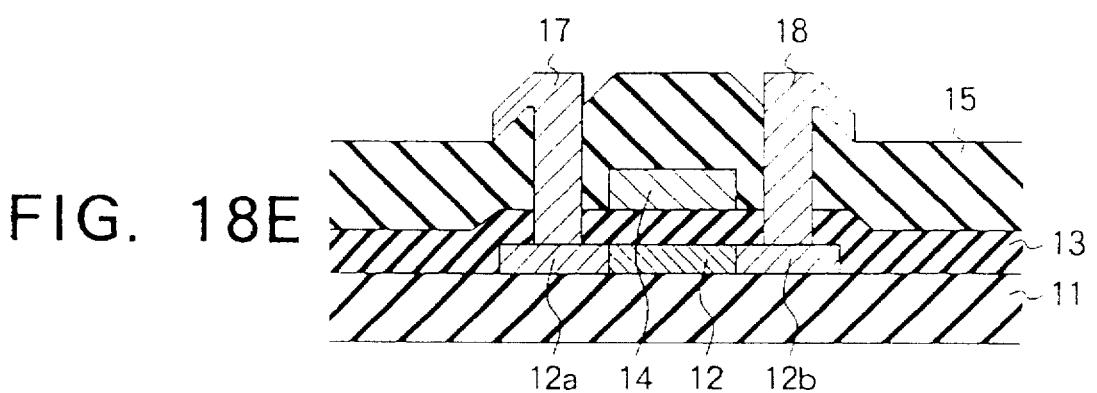

Last, contact holes are patterned. A metal for a source region and a drain electrode are formed by the sputter unit. Examples of the metal are aluminum, molybdenum, tantalum, tungsten, titanium, copper, alloys thereof, and laminates thereof. If necessary, the resultant structure is annealed at 450° C. so as to decrease the contact resistance between the source/drain regions and source/drain electrode. In FIG. 18E, reference numeral 17 is the source electrode and reference numeral 18 is the drain electrode.

As a result, a TFT is obtained (see FIG. 18E).

Figure 19:
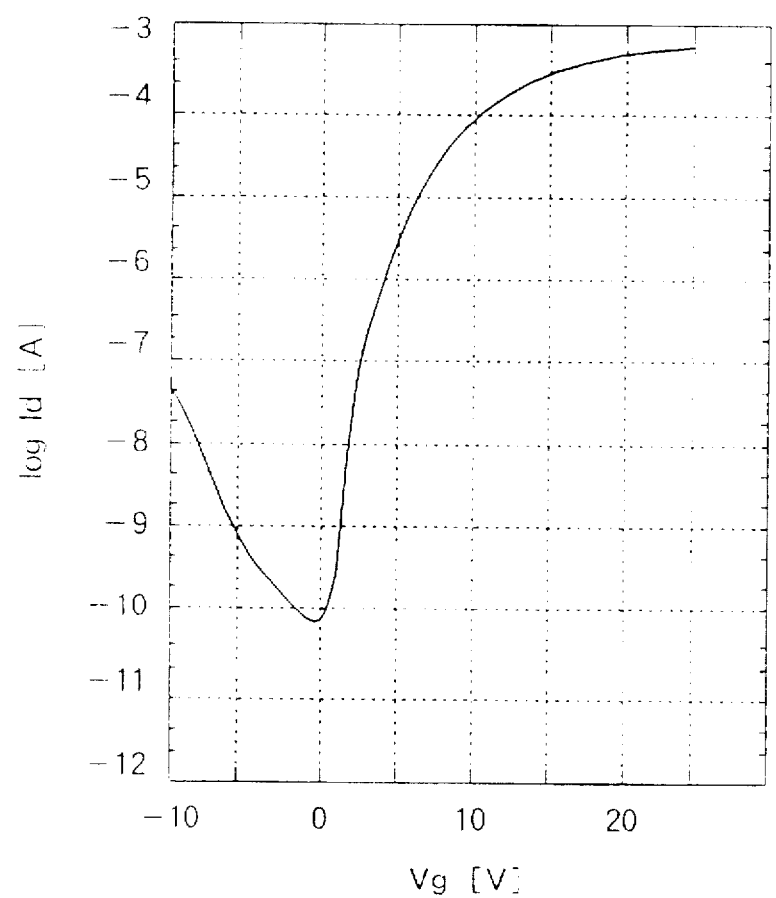
FIG. 19 is a graph showing an example of Id - vg characteristics of a thin film transistor according to the present invention.

With the thin film transistor fabricated by the fabrication method according to the sixth embodiment, the transistor characteristics (Id - vg characteristics) were measured. The measured results show good characteristics as shown in FIG. 19. In reality, the mobility was around 100 cm$^2$/Vs and Vth was around 4 V.

The hydrogen concentration in each layer of the fabricated thin film transistor was measured. The concentration of hydrogen of the inter-layer insulation film was $5 \times 10^{20}$ atoms/cm$^3$.

On the other hand, the concentration of hydrogen of the poly-Si film as a semiconductor layer was $1 \times 10^{19}$ atoms/cm$^3$ to $4 \times 10^{19}$ atoms/cm$^3$.

The concentration of hydrogen of the gate insulation film was $2 \times 10^{20}$ atoms/cm$^3$ to $6 \times 10^{20}$ atoms/cm$^3$ Seventh Embodiment Drive circuit integrated liquid crystal display apparatus FIGS. 21A to 21E are sectional views showing fabrication steps of an example of a drive circuit integrated liquid crystal display apparatus according to the present invention. In a seventh embodiment, a drive circuit is composed of COMS. A pixel TFT is composed of an n-channel type TFT.

A poly-Si layer as a semiconductor layer is formed on a transparent insulation substrate 11 by the LPCVD method. The poly-Si layer may be formed of a-Si by the solid phase crystallization method. Alternatively, the poly-Si layer may be formed of a-Si by the laser annealing method. Thereafter, the poly-Si layer is patterned so as to form semiconductor layer portions 301a, 301b, and 301c of the drive circuit portion and the pixel portion.

After that, a low resistance semiconductor layer 302 as an electrode of a storage capacitor is formed. A gate oxide film 13 that is a silicon oxide film is formed. A film as a gate electrode is formed on the gate oxide film 13. The resultant structure is patterned and thereby gate electrodes 14a, 14b, and 14c and a storage capacitor electrode 14d are formed. Examples of the material of the gate electrodes are metals such as Al, W, Mo, and Ta, alloys thereof, silicides thereof, and poly-Si doped with impurities.

Next, with for example a resist, a transistor side of the CMOS is protected. Phosphorus is doped with a dose of for example $5 \times 10^{15}$ ions/cm$^2$ by for example the ion doping method. Thus, a source region 305a and a drain region 306a of the n-channel type TFT of the drive circuit and a source region 305b and a drain region 306b of the pixel circuit are formed.

Thereafter, with for example a resist, the other transistor side of the CMOS is protected. Boron is doped with a dose of $1\times10^{15}$ ions/cm$^2$ by the ion doping method. Thus, a source region 305c and a drain region 306c of the p-channel type TFT of the drive circuit are formed (see FIG. 21A).

Figure 21A:
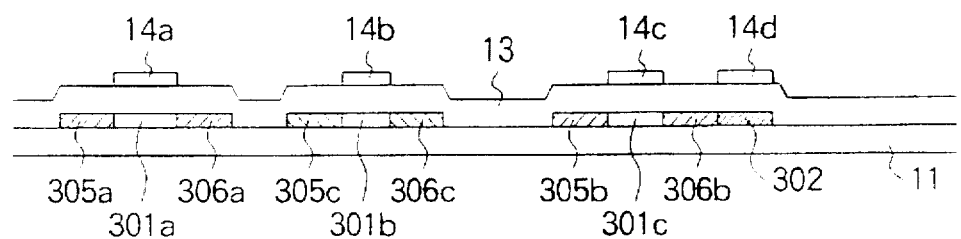
FIGS. 21A, 21B, 21C, 21D, and 21E are outlined sectional views showing fabrication steps of the second thin film transistor according to the present invention.
Figure 21B:
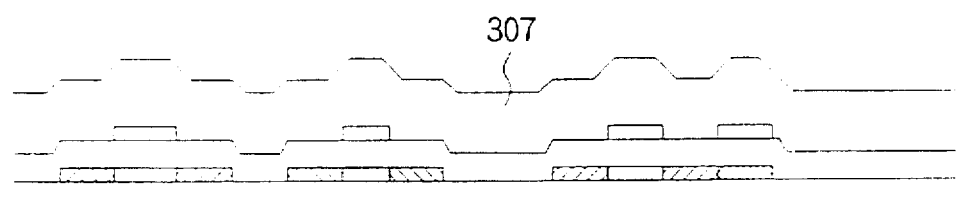

Thereafter, in the same forming method as the sixth embodiment (for example, the plasma CVD method), an inter-layer insulation film 307 containing hydrogen with a concentration of $1\times10^{20}$ atoms/cm$^3$ or more (see FIG. 21B).

Figure 21C:
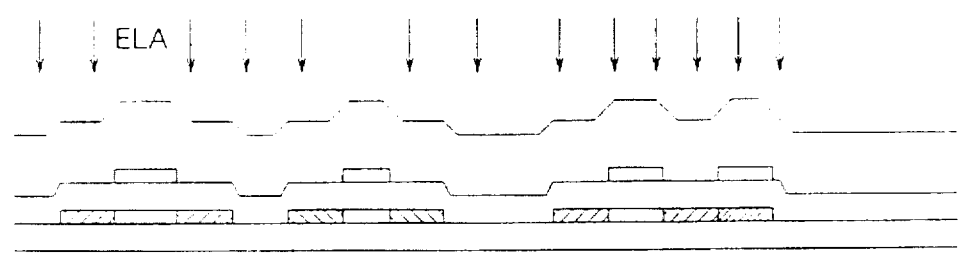

As shown in FIG. 21C, a high energy beam is radiated to the inter-layer insulation film by for example the excimer laser annealing method so as to activate impurities of the source region and the drain region.

Figure 21D:
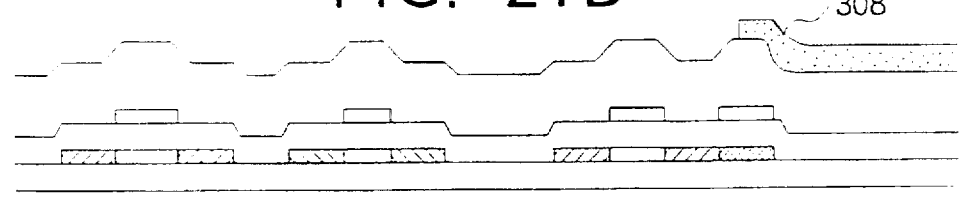
Figure 21E:
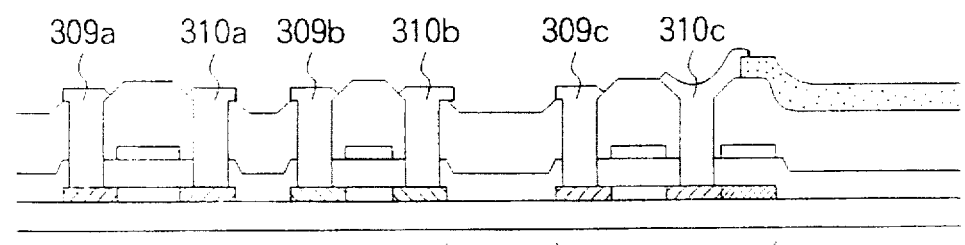

Next, a transparent electrode 308 as a pixel electrode composed of for example ITO is formed and then patterned (see FIG. 21D).

Thereafter, contact holes are patterned and thereby source electrodes and drain electrodes 309a, 309b, 309c, 310a, 310b, and 310c are formed. If necessary a protection film is further formed (see FIG. 21E).

In this embodiment, the coplanar type TFT was described. Without departing from the spirit and scope of the present invention, various modifications are available.

To decrease a leak current (that flows when the TFT is turned off), the pixel TFT may be formed in the LDD structure. Alternatively, the pixel TFT may be formed in a multi-gate (double-gate) type TFT. In addition, it is clear that the pixel electrode (ITO) and source/drain electrodes may be formed in the reverse order.

Eighth Embodiment

Figure 22:
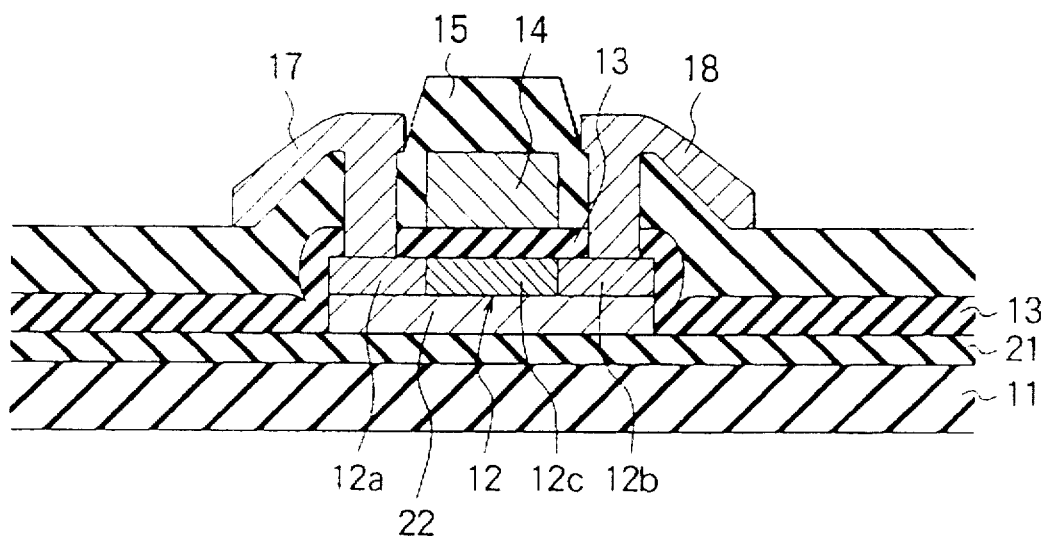
FIG. 22 is an outlined sectional view showing an example of a third thin film transistor according to the present invention.

FIG. 22 is an outlined sectional view showing a third thin film transistor according to the present invention.

A first substrate protection film 21 is formed on a transparent insulation substrate 11. A second substrate protection film 22 with a predetermined shape and a predetermined thickness is formed on the first substrate protection film. The thickness of the second substrate protection film may be for example in the range from 50 nm to 300 nm.

A semiconductor film 12 having a high resistance channel region 12c and a plurality of low resistance regions that are source/drain contact regions 12a and 12b is formed on the second substrate protection film 22. In other words, the channel region 12c and the source/drain contact regions 12a and 12b are formed on the second substrate protection film 22. The height of the semiconductor film 12 is larger than the height of the first substrate protection film 21 by the thickness of the second substrate protection film 22. The semiconductor film 12 is formed of for example poly-Si.

A gate insulation film 13 is formed so that the contact regions 12a and 12b of the semiconductor film 12 have opening portions. A gate electrode 14 is formed on the gate insulation film 13 corresponding to the channel region 12c of the semiconductor film 12.

An inter-layer insulation film 15 having opening portions formed on the gate insulation film 13 for the contact regions 12a and 12b of the semiconductor film 12 is disposed above the gate electrode 14. A source electrode 17 and a drain electrode 18 are formed on the inter-layer insulation film 15 so that the contact region 12a and 12b of the semiconductor film 12 is connected to the source electrode 17 and the drain electrode 18 through the opening portions in the gate insulation film 13 and the inter-layer insulation film 15. When the thin film transistor is reversely driven, the high voltage electrode becomes the source electrode, whereas the low voltage electrode becomes the drain electrode.

As described in the fifth to seventh embodiments, the inter-layer insulation film 15 may be formed so that the concentration of hydrogen of the film is $1\times10^{20}$ atoms/cm$^3$. This applies to each of the following embodiments.

Figure 23:
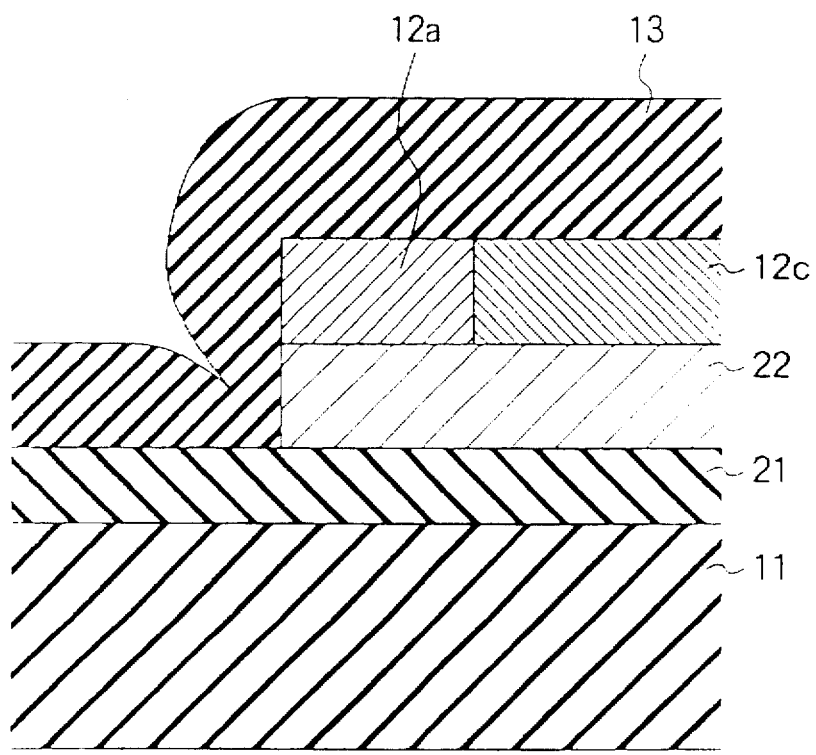
FIG. 23 is an enlarged sectional view showing an edge portion of the third thin film transistor according to the present invention.

FIG. 23 is an enlarged sectional view showing an edge portion of the contact region 12a of the thin film transistor shown in FIG. 22. In this structure, even if the gate insulation film is formed of a film that has a bad coating characteristic by for example the ECR-PECVD method, the edge surface of the contact region can be well coated. Thus, a thin film transistor with excellent characteristics that prevent a leak current and a dielectric breakdown can be obtained.

Ninth Embodiment

Figure 24:
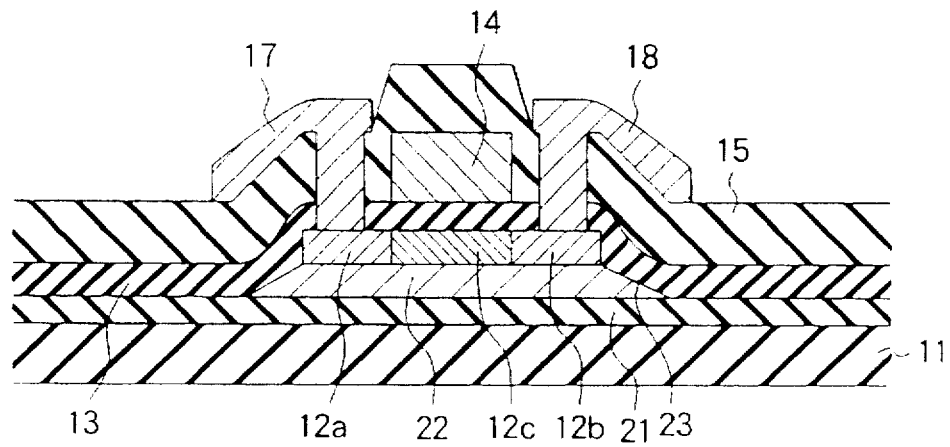
FIG. 24 is an outlined sectional view showing an example of the third thin film transistor according to the present invention.

FIG. 24 is an outlined sectional view showing an example of a thin film transistor according to the present invention. In the thin film transistor shown in FIG. 24, an edge surface 23 of a second substrate protection film 22 formed on a first substrate protection film 21 is tapered. A semiconductor film 12 is formed on the tapered second substrate protection film 22. Since the second substrate protection film 22 is tapered, the semiconductor film 12 (in particular, edge portions of contact regions 12a and 12b) are well coated with a gate insulation film 13.

Figure 25:
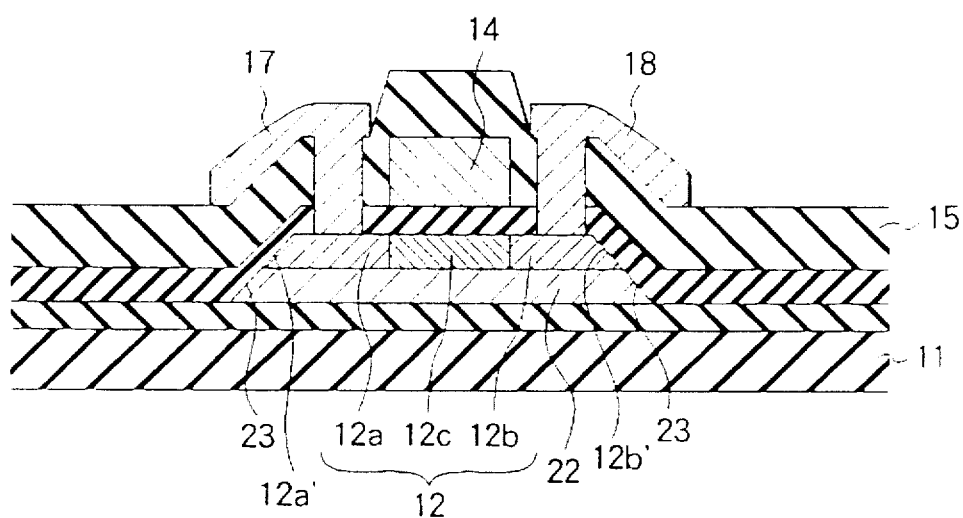
FIG. 25 is an outlined sectional view showing an example of the third thin film transistor according to the present invention.

In addition, as shown in FIG. 25, edge surfaces 12a' and 12b' of a semiconductor film 12 may be tapered so that an edge surface 23 of a second substrate protection film 22 and the edge surfaces 12a' and 12b' of the semiconductor film 12 form a smooth plane. These taper shapes may be formed by the oxide film forming method, the RIE method, or the like.

Tenth Embodiment

Figure 26:
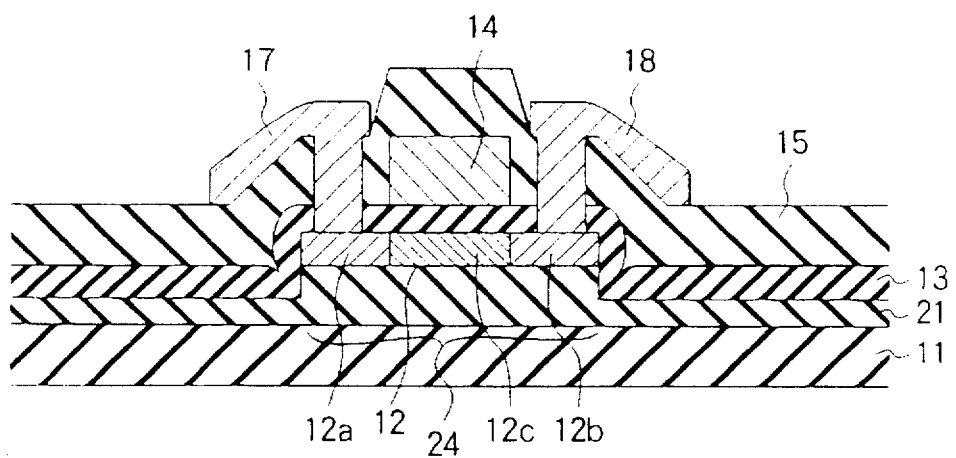
FIG. 26 is an outlined sectional view showing an example of a fourth thin film transistor according to the present invention.

FIG. 26 is an outlined sectional view showing an example of a thin film transistor according to the present invention. In the thin film transistor shown in FIG. 26, a convex substrate protection film 21 having a thick region is formed on a transparent insulation substrate 11. A semiconductor film 12 having a high resistance region and a plurality of low resistance regions is formed on the thick region 24 of the substrate protection film 21. In other words, a channel region 12c, a source contact region 12a, and a drain contact region 12b are formed on the thick region 24 of the substrate protection film 21. The height of the semiconductor film 12 is larger than the height of the substrate protection film 21 by the thickness of the thick region 24.

A gate insulation film 13 having opening portions for contact regions 12a and 12b that are low resistance regions is formed on the semiconductor film 12. A gate electrode 14 is formed on the gate insulation film 13 corresponding to a channel region 12c that is a high resistance region of the semiconductor film 12.

An inter-layer insulation film 15 having opening portions formed on the gate insulation film 13 for the contact regions 12a and 12b of the semiconductor film 12 is disposed above the gate electrode 14. A source electrode 17 and a drain electrode 18 are formed on the inter-layer insulation film 15 so that the contact regions 12a and 12b of the semiconductor film 12 are electrically connected to the source electrode 17 and the drain electrode 18 through the opening portions formed in the gate insulation film 13 and the inter-layer insulation film 15.

As described in the fifth to seventh embodiments, the inter-layer insulation film 15 may be formed so that the concentration of hydrogen of the film becomes $1\times10^{20}$ atoms/cm$^3$. When the thin film transistor is reversely driven, the above-described relation of the source electrode and the drain electrode is applied.

Figure 27:
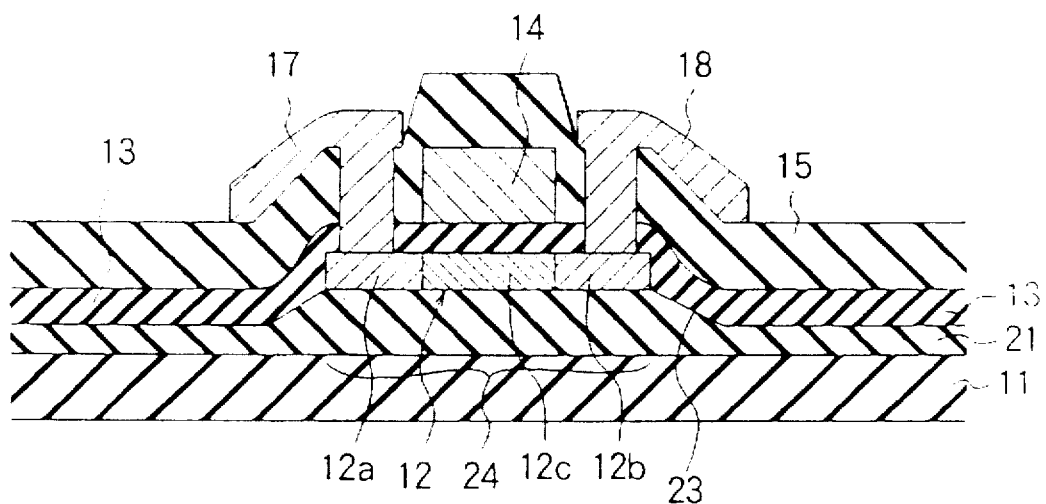
FIG. 27 is an outlined sectional view showing an example of the fourth thin film transistor according to the present invention.

In addition, as shown in FIG. 27, edge portions 23 of a thick region 24 formed as a convex portion are tapered on a substrate protection film 21. A semiconductor film 12 is formed on the tapered convex region 24. When the substrate protection film 21 is tapered, the semiconductor film 12 (in particular, the edge portions of the contact regions 12a and 12b) is well coated with the gate insulation film 13.

Figure 28:
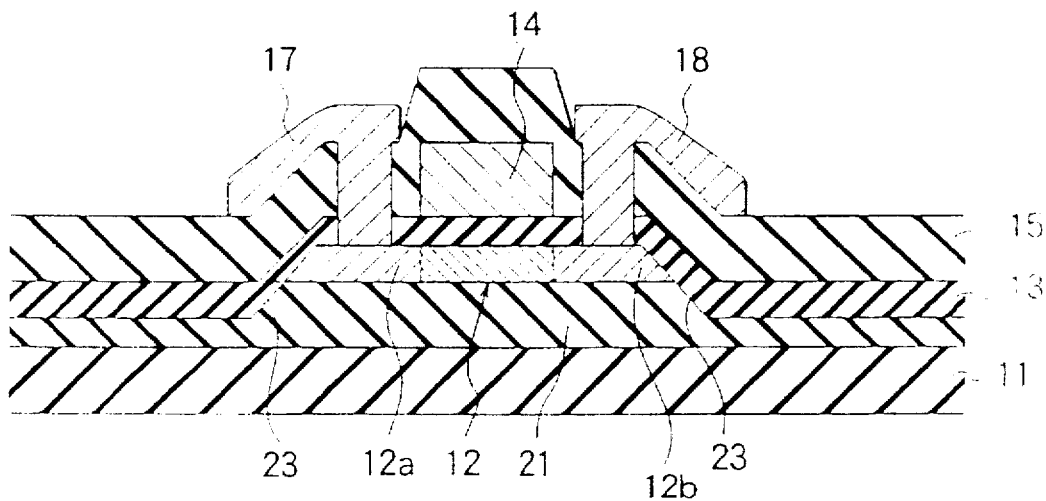
FIG. 28 is an outlined sectional view showing an example of the fourth thin film transistor according to the present invention.

Moreover, as shown in FIG. 28, edge portions of contact regions 12a and 12b of a semiconductor film 12 may be tapered. The edge portions of the contact regions 12a and 12b and the tapered edge surface 23 of the thick convex region 24 of the substrate protection film 21 may form a smooth plane.

Eleventh Embodiment

FIGS. 29A, 29B, 29C, and 29D are sectional views for explaining fabrication steps of an example of a thin film transistor according to the present invention.

A substrate protection film 21 is formed on a transparent insulation substrate 11. A poly-Si semiconductor film 12 as an activation layer is formed on the substrate protection film 21 (see FIG. 29A).

Thereafter, with a resist 30, the activation layer is patterned by the lithography process. With a mask of the resist, the poly-Si semiconductor film 12 is etched out using for example a microwave by the chemical dry etching method with etching gases of $CF_4$ and $O_2$ (in the condition that the ratio of flow rates of $CF_4$: 180 sccm and $O_2$: 90 sccm— namely, the flow rate of $O_2$ is half of the flow rate of $CF_4$) at 30 Pa and 600 W (see FIG. 29B).

Figure 29A:
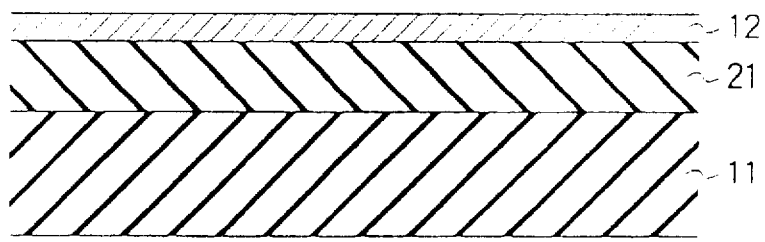
FIGS. 29A, 29B, 29C, and 29D are sectional views showing fabrication steps of a second substrate protection film of the forth thin film transistor according to the present invention.
Figure 29B:
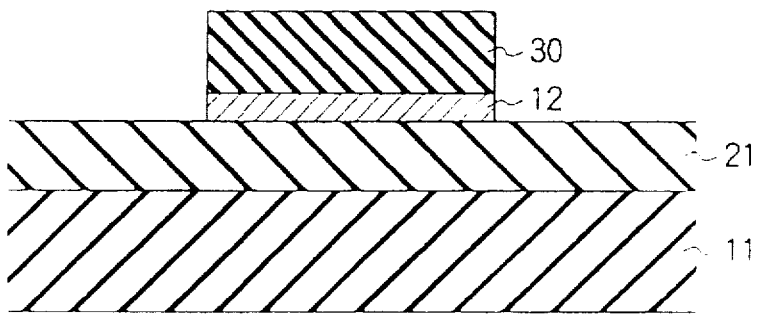
Figure 29C:
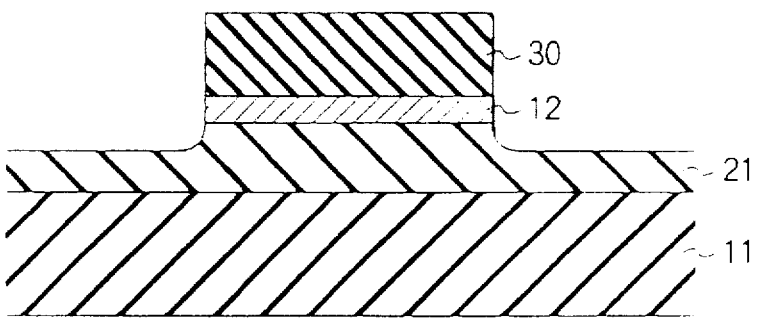

Next, as shown in FIG. 29C, the substrate protection film 21 below edge portions of the remaining poly-silicon semiconductor film 12 is etched out. To form a stage shape, the poly-Si semiconductor film 12 with a thickness of 50 nm is etched out for 30 sec. In addition, the substrate protection film 21 with a thickness of 30 nm is etched out for 180 sec. Thus, a total of 210 sec is required for the etching processes.

Figure 29D:
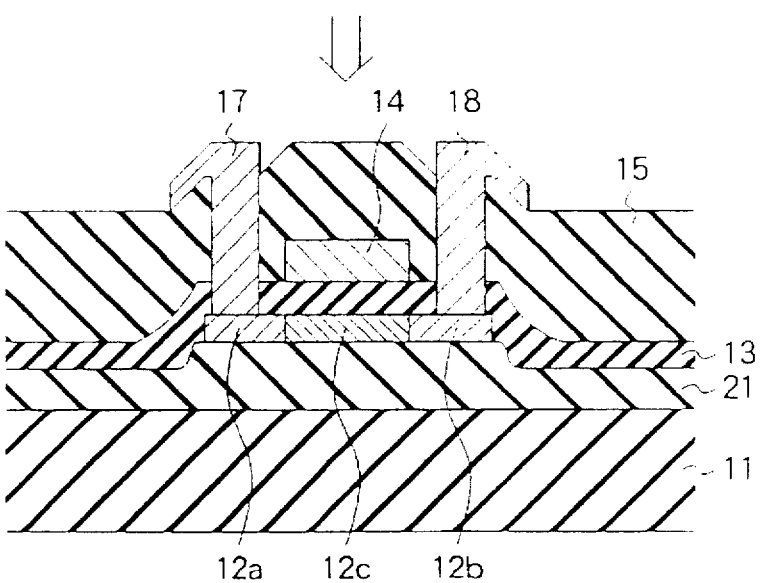

Thereafter, the resist 30 is peeled off. Thus, the structure as shown in FIG. 29D is obtained. Thereafter, the fabrication steps according to the sixth embodiment are used.

Twelfth Embodiment

Figure 30:
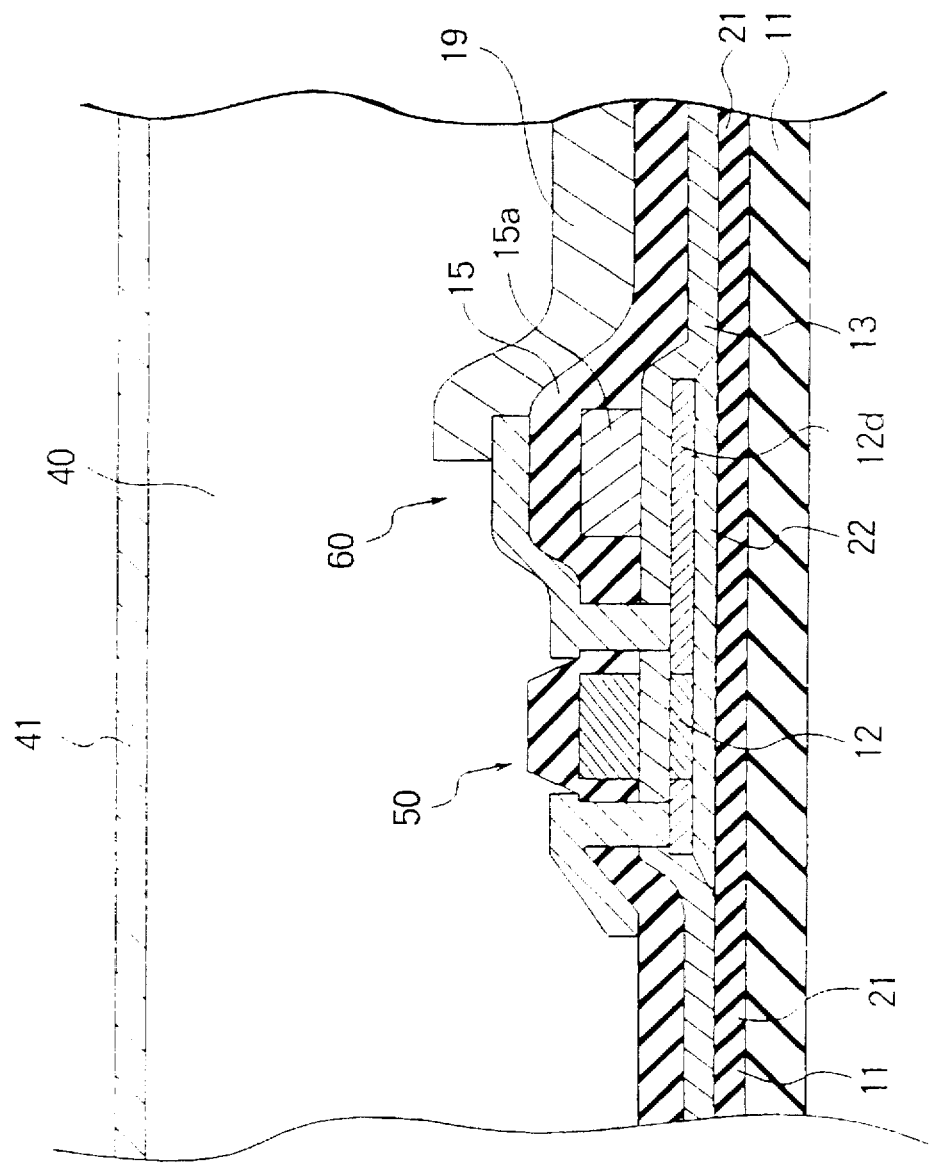
FIG. 30 is an outlined sectional view showing an application of a thin film transistor for a liquid crystal display apparatus according to the present invention.

FIG. 30 is an outlined sectional view showing a liquid crystal display apparatus having a thin film transistor according to the present invention.

A first substrate protection film 21 is formed on a transparent insulation substrate 11. A second substrate protection film 22 in a predetermined shape is formed on the first substrate protection film 21. A thin film transistor 50 (that is a channel region 12 composed of a poly-Si semiconductor film), a storage capacitor 60, and a pixel electrode 19 are formed on the second substrate protection film 22. In the storage capacitor 60, a lower storage electrode 12d is formed on the transparent insulation substrate 11. A gate insulation film 13 that forms a storage capacitor is formed on a lower storage capacitor electrode 12d. An upper storage capacitor electrode 15a is formed on an insulation film 13. An inter-layer insulation film 15 and the pixel electrode 19 are formed on the electrode 15a. The liquid crystal layer 40 is disposed between the resultant structure and an opposite substrate 41 that has an opposite electrode.

When the second substrate protection film 21 is formed below the thin film transistor 50 and the storage capacitor 60, the edge portions of the contract region of the semiconductor film and the edge portions of the electrode of the lower storage capacitor are well coated.

The first substrate protection film 21 may be composed of silicon oxide. On the other hand, the second substrate protection film 22 may be composed of silicon nitride. In this structure, when impurities are activated by a laser and thereby a contact region is formed, since the laser is not directly radiated to the silicon nitride film, it does not crack.

When the first substrate protection film 21 is composed of a laminate of silicon nitride as a higher layer and silicon oxide as a lower layer, the same effects can be obtained.

Figure 31:
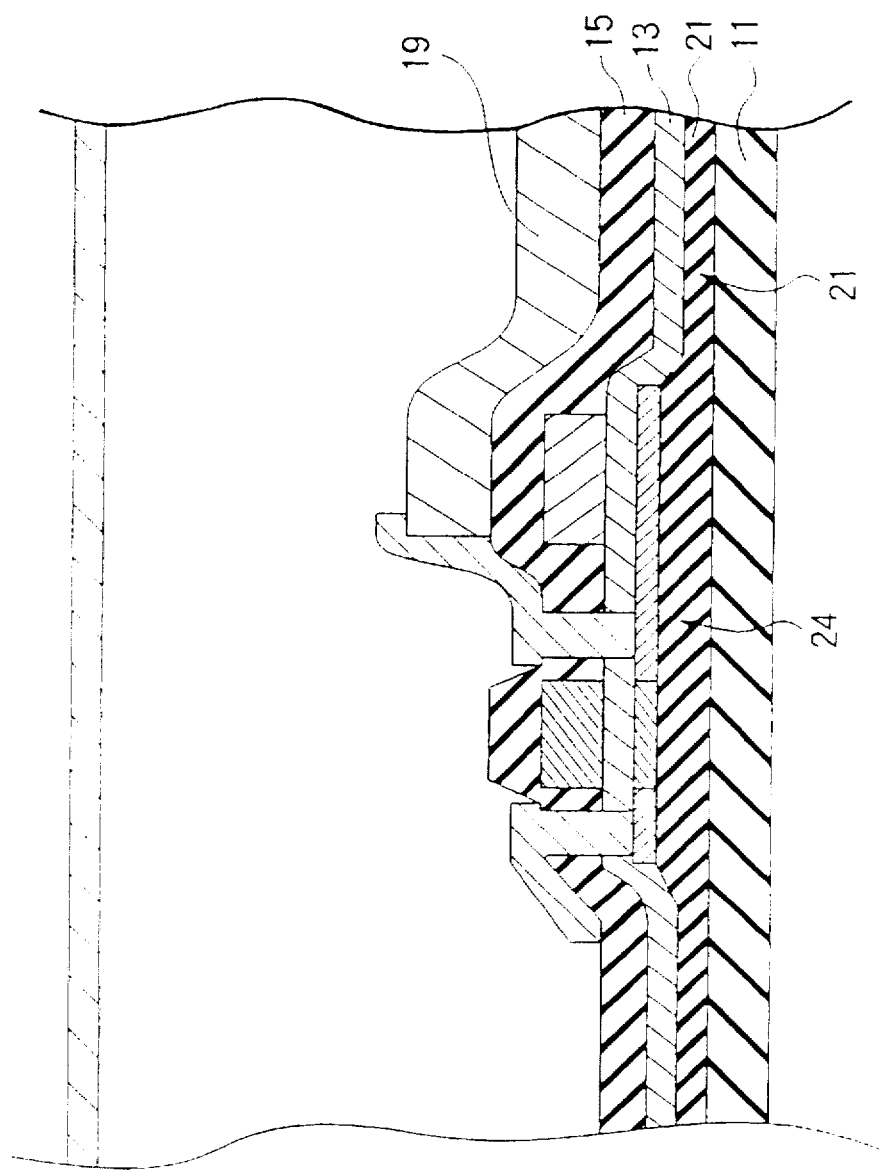
FIG. 31 is an outlined sectional view showing another application of a thin film transistor for a liquid crystal display apparatus according to the present invention.

As with the thin film transistor shown in FIG. 26, a substrate protection film 21 may have a thick region 24 in a predetermined shape, the thick region 24 being composed of a first substrate protection film 21 and a second substrate protection film 22. FIG. 31 shows an example of such a structure.

In this case, when the substrate protection film 21 is composed of a laminate of a silicon nitride layer as a lower layer and a silicon oxide layer as a higher layer, the substrate protection film 21 does not crack.

In addition, when the edge portions of the second substrate protection film and the edge portions of the thick region of the substrate protection film are tapered, the coating characteristic is improved. Alternatively, the edge portions of the contact region of the semiconductor film may be tapered. The edge portions of the contact region and the edge surfaces of the substrate protection film may form a smooth plane.

The thin film transistors and the semiconductor apparatuses shown in FIGS. 17 to 31 can be used for a liquid crystal display apparatus. In addition, they can be used for a contact sensor, an X-ray sensor, and so forth.

In the second thin film transistor according to the present invention, with the structure of the second substrate protection film or the thick region of the substrate protection film, a thin film transistor that has a good step coverage of the gate insulation film, good characteristics, and high productivity can be obtained.

Moreover, in the thin film transistors according to the present invention, since the concentration of hydrogen of the inter-layer insulation film is adjusted, a thin film transistor that has a good contact state between the gate electrode and the inter-layer insulation film (thereby a high peel-off resistance), a low fabrication cost, a high yield, and a high productivity can be provided.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A field effect type non-single crystal semiconductor apparatus having a gate electrode formed on an insulation substrate, and a source region and a drain region disposed opposite to the gate electrode through a gate insulation film and formed in an impurity doped non-single crystal semiconductor layer doped with hydrogen and n-type impurities or p-type impurities, the apparatus comprising:

contact holes formed in the source region and drain region and disposed on the front surfaces of the source region and drain region; and electrode wires formed in the contact holes and ohmic-contacted in the source region and drain region, wherein the contact holes have a depth from a surface of the source region and drain region to a bottom surface of the contact holes in the range of 1 to 15 nm.

2. A non-single crystal semiconductor apparatus, comprising:

an insulation substrate;

a buffer layer formed on said insulation substrate;

a non-single crystal semiconductor layer formed on said buffer layer, said non-single crystal semiconductor layer being composed of a channel region, a source region, and a drain region, the channel region being disposed between the source region and the drain region, the source region and the drain region having contact holes formed on surfaces thereof, wherein a thickness of contact hole portions of the non-single crystal semiconductor layer is thinner in a range of 1 to 15 nm than a thickness of the non-single crystal semiconductor layer except for the contact hole portions;

a gate electrode formed on the channel region through a gate insulation film;

an inter-layer insulation film for coating said non-single crystal semiconductor layer having said gate electrode except for the contact hole portions; and a plurality of electrodes connected to the contact holes and formed on said inter-layer insulation film.

3. A non-single crystal semiconductor apparatus, comprising:

an insulation substrate;

a buffer layer formed on said insulation substrate;

a non-single crystal semiconductor layer formed on said buffer layer, said non-single crystal semiconductor layer being composed of a channel region, a source region, and a drain region, the channel region being provided between the source region and the drain region;

contact holes being formed in the source region and the drain region and having a bottom surface, the bottom surface of the contact holes being lowered from a surface of said non-single crystal semiconductor layer in the range of 1 to 15 nm;

a gate insulation film formed on said non-single crystal semiconductor layer except for the contact holes;

a gate electrode formed on the channel region through the gate insulation film;

an inter-layer insulation film for coating the surface of said gate insulation film having said gate electrode except for the contact hole portions; and a plurality of electrodes connected to the contact holes and formed on said inter-layer insulation film.

4. A thin film transistor, comprising:

a substrate protection film formed on a transparent insulation substrate;

a semiconductor film having a channel region and a contact region formed on said substrate protection film, the channel region being surrounded by the contact region;

a gate insulation film formed over said semiconductor film, said gate insulation film having an opening portion for the contact region of said semiconductor film;

a gate electrode formed in a region corresponding to the channel region of said semiconductor film on said gate insulation film;

an inter-layer insulation film formed over said gate insulation film on which said gate electrode is formed, said inter-layer insulation film having an opening portion for the contact region of said semiconductor film, the concentration of hydrogen of said inter-layer insulation film being more than $1 \times 10^{20}$ atoms/cm$^3$ and less than $1 \times 10^{22}$ atoms/cm$^3$; and a plurality of electrodes formed on said inter-layer insulation film and connected to the contact region of said semiconductor film through the opening portion.

5. A thin film transistor, comprising:

a first substrate protection film formed on a transparent insulation substrate;

a second substrate protection film formed in a predetermined shape on said first substrate protection film, said second substrate protection film having tapered edge surfaces;

a semiconductor film formed on an upper surface of said second substrate protection film, said semiconductor film being composed of a channel region and a contact region, the channel region being surrounded by the contact region;

a gate insulation film formed over said semiconductor film, said gate insulation film having an opening portion for the contact region of said semiconductor film;

a gate electrode formed in a region corresponding to the channel region of said semiconductor film on said gate insulation film;

an inter-layer insulation film formed over said gate insulation film on which said gate electrode is formed, said inter-layer insulation film having an opening portion for the contact region of said semiconductor film; and a plurality of electrodes formed on said inter-layer insulation film, said plurality of electrodes being connected to the contact region of said semiconductor film through the opening portion.

6. The thin film transistor as set forth in claim 5, wherein said semiconductor film has tapered edge surfaces which are continuously formed with said tapered edge surfaces of said second substrate protection film to form a smooth plane.

7. The thin film transistor as set forth in claim 5, or 14, wherein the concentration of hydrogen of said inter-layer insulation film is $1 \times 10^{20}$ atoms/cm$^3$ or more so as to control a contact state between said gate electrode and said inter-layer insulation film.

8. The thin film transistor as set forth in claim 5, wherein the gap between said first substrate protection film and said second substrate protection film is in the range from 1 nm to 100 nm.

9. The thin film transistor as set forth in claim 5, wherein the gap between said first substrate protection film and said second substrate protection film is in the range from 10 nm to 50 nm.

10. A thin film transistor, comprising:

a substrate protection film formed on a transparent insulation substrate, said substrate protection film having a thick region in a predetermined shape, said think region having a surface for forming a semiconductor film and having tapered edge surfaces;

the semiconductor film formed on the surface of the thick region, said semiconductor film being composed of a channel region and a contact region, the channel region being surrounded by said contact region;

a gate insulation film formed over said semiconductor film, said gate insulation film having an opening portion for the contact region of said semiconductor film;

a gate electrode formed in a region corresponding to the channel region of said semiconductor film on said gate insulation film;

an inter-layer insulation film formed over said gate insulation film on which said gate electrode is formed, said inter-layer insulation film having an opening portion for the contact region of said semiconductor film, and a plurality of electrodes formed on said inter-layer insulation film, said plurality of electrodes being connected to the contact region of said semiconductor film through the opening portion.

11. The thin film transistor as set forth in claim 10, wherein the concentration of hydrogen of said inter-layer insulation film is more than $1\times10^{20}$ atoms/cm$^3$ and less than $1\times10^{22}$ atoms/cm$^3$ so as to control a contact state between said gate electrode and said inter-layer insulation film.

12. The thin film transistor as set forth in claim 10, wherein a thickness of the thick region of said substrate protection film is in the range from 1 nm to 100 nm.

13. The thin film transistor as set forth in claim 10, wherein a thickness of the thick region of said substrate protection film is in the range from 10 nm to 50 nm.

14. A liquid crystal display apparatus having thin film transistors as pixel switching devices disposed in a matrix shape, each of the thin film transistors comprising:

a first substrate protection film formed on a transparent insulation substrate;

a second substrate protection film formed in a predetermined shape on said first substrate protection film, said second substrate protection film having tapered edge surfaces;

a semiconductor film formed on an upper surface of said second substrate protection film, said semiconductor film being composed of a channel region and a contact region, the channel region being surrounded by the contact region;

a gate insulation film formed over said semiconductor film, said gate insulation film having an opening portion for the contact region of said semiconductor film;

a gate electrode formed in a region corresponding to the channel region of said semiconductor film on said gate insulation film;

an inter-layer insulation film formed over said gate insulation film on which said gate electrode is formed, said inter-layer insulation film having an opening portion for the contact region of said semiconductor film; and a plurality of electrodes formed on said inter-layer insulation film, said plurality of electrodes being connected to the contact region of said semiconductor film through the opening portion.

15. The liquid crystal display apparatus as set forth in claim 14, wherein a storage capacitor is formed on the second substrate protection film in the vicinity of the thin film transistor.

16. The liquid crystal display apparatus as set forth in claim 14, wherein the concentration of hydrogen of the inter-layer insulation film is more than $1\times10^{20}$ atoms/cm$^3$ and less than $1\times10^{22}$ atoms/cm$^3$ so as to control a contact state between said gate electrode and said inter-layer insulation film.

17. A liquid crystal display apparatus having thin film transistors as pixel switching devices disposed in a matrix shape, each of the thin film transistors comprising:

a substrate protection film formed on a transparent insulation substrate, said substrate protection film having a thick region, said thick region having a surface for forming a semiconductor film and having tapered edge surfaces;

the semiconductor film formed on the surface of the thick region, said semiconductor film being composed of a channel region and a contact region, the channel region being surrounded by said contract region;

a gate insulation film formed over said semiconductor film, said gate insulation film having an opening portion for the contact region of said semiconductor film;

a gate electrode formed in a region corresponding to the channel region f said semiconductor film on said gate insulation film;

an inter-layer insulation film formed over said gate insulation film on which said gate electrode is formed, said inter-layer insulation film having an opening portion for the contact region of said semiconductor film; and a plurality of electrodes formed on said inter-layer insulation film, said plurality of electrodes being connected to the contact region of said semiconductor film through the opening portion.

18. The liquid crystal display apparatus as set forth in claim 17, wherein a storage capacitor is formed on the second substrate protection film in the vicinity of the thin film transistor.

19. The liquid crystal display apparatus as set forth in claim 17, wherein the concentration of hydrogen of the inter-layer insulation film is $1\times10^{20}$ atoms/cm$^3$ and less than $1\times10^{22}$ atoms/cm$^3$ so as to control a contact state between the gate electrode and the inter-layer insulation film.

* * * * *

UNITED STATES PATENT AND TRADEMARK OFFICE
CERTIFICATE OF CORRECTION

PATENT NO.: 5,763,904

DATED: June 9, 1998

INVENTOR(S): Nakajima et al.

It is certified that an error appears in the above-identified patent and that said Letters Patent is hereby corrected as shown below:

Claim 7, column 24, line 32, "claim 5, or 14," should read --claim 5 or 6,--.

*Claim 17, column 26, line 19, "contract" should read --contact--.

Signed and Sealed this

Nineteenth Day of October, 1999

Attest:

Q. TODD DICKINSON

*Attesting Officer*

*Acting Commissioner of Patents and Trademarks*